United States Patent
Hristov

(10) Patent No.: US 8,576,182 B2
(45) Date of Patent: Nov. 5, 2013

(54) METHODS AND APPARATUSES TO TEST THE FUNCTIONALITY OF CAPACITIVE SENSORS

(75) Inventor: Luben Hristov, Sofia (BG)

(73) Assignee: Atmel Corporation, San Jose, CA (US)

( * ) Notice: Subject to any disclaimer, the term of this patent is extended or adjusted under 35 U.S.C. 154(b) by 685 days.

(21) Appl. No.: 12/552,195

(22) Filed: Sep. 1, 2009

(65) Prior Publication Data

US 2011/0050620 A1    Mar. 3, 2011

(51) Int. Cl.
*G06F 3/041*    (2006.01)

(52) U.S. Cl.
USPC ........................................ 345/173; 178/18.02

(58) Field of Classification Search
None
See application file for complete search history.

(56) References Cited

U.S. PATENT DOCUMENTS

| | | | |
|---|---|---|---|
| 7,663,607 B2 | 2/2010 | Hotelling | |
| 7,875,814 B2 | 1/2011 | Chen | |
| 7,920,129 B2 | 4/2011 | Hotelling | |
| 8,031,094 B2 | 10/2011 | Hotelling | |
| 8,031,174 B2 | 10/2011 | Hamblin | |
| 8,040,326 B2 | 10/2011 | Hotelling | |
| 8,049,732 B2 | 11/2011 | Hotelling | |
| 8,179,381 B2 | 5/2012 | Frey | |
| 2006/0221061 A1* | 10/2006 | Fry | 345/173 |
| 2007/0200831 A1* | 8/2007 | Wang | 345/173 |
| 2009/0231286 A1* | 9/2009 | Kuo | 345/173 |
| 2009/0289910 A1* | 11/2009 | Hattori | 345/173 |
| 2009/0315835 A1* | 12/2009 | De Goes et al. | 345/173 |
| 2009/0315854 A1 | 12/2009 | Matsuo | |
| 2012/0242588 A1 | 9/2012 | Myers | |
| 2012/0242592 A1 | 9/2012 | Rothkopf | |
| 2012/0243151 A1 | 9/2012 | Lynch | |
| 2012/0243719 A1 | 9/2012 | Franklin | |

FOREIGN PATENT DOCUMENTS

WO    WO 2009056820 A1 *    5/2009
WO    WO 2012/129247         9/2012

OTHER PUBLICATIONS

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

* cited by examiner

*Primary Examiner* — Adam R Giesy
(74) *Attorney, Agent, or Firm* — Baker Botts LLP

(57) ABSTRACT

Some embodiments include apparatus and methods to test a device having a driving layer and a sensing layer. A test signal is applied to electrodes of the driving layer in a capacitive load state, with a capacitive load applied, and in an ambient state, without a capacitive load applied. Measured values are obtained at the sensing layer for each state. The measured values are compared with threshold values. A report is generated when a measured value violates a threshold. In one embodiment, the driving layer and the sensing layer form multiple capacitive electrodes within a touch sensor. The measured values are related to mutual capacitance values of the touch sensor.

25 Claims, 19 Drawing Sheets

METHODS AND APPARATUSES TO TEST THE FUNCTIONALITY OF CAPACITIVE SENSORS

BACKGROUND

User interfaces provide the ability to utilize functions provided by electronic products and applications executed by such products. Attractive, intuitive interfaces provide strong appeal to consumers. Touchscreens may be used to enhance a variety of functions and turn everyday devices into exciting new products. Touchscreens provide an interface that responds to a wide variety of types and gestures, differentiating between single and two-finger touch, as well as recognizing a variety of actions. Touchscreens may be implemented using a variety of technologies, where a touch to the surface changes electrical relationships within the touchscreen. Quality testing of a touchscreen device or capacitive keyboard involves anticipating the operating conditions of the touchscreen to confirm consistent and acceptable performance.

DETAILED DESCRIPTION

Figure 1:
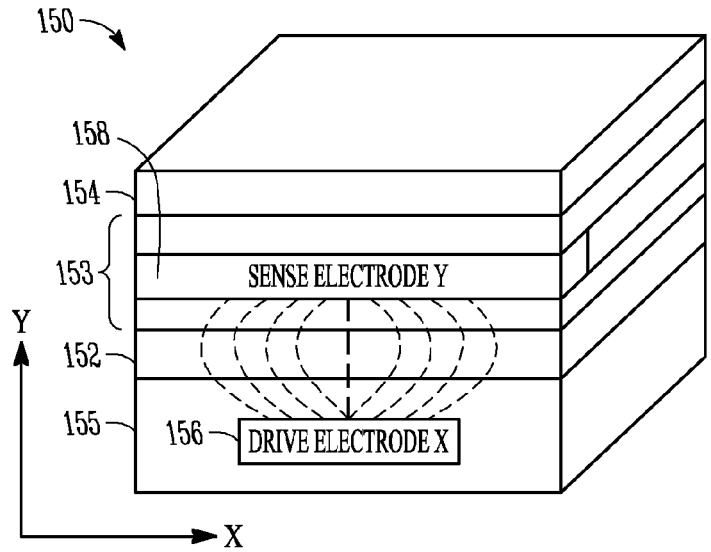
FIG. 1 is a block diagram illustrating a dual layer capacitive device, according to an example embodiment.

In the following description, reference is made to the accompanying drawings that form a part hereof, and in which is shown by way of illustration specific embodiments which may be practiced. These embodiments are described in sufficient detail to enable those skilled in the art to practice embodiments of the invention. Other embodiments may be utilized and structural, logical and electrical changes may be made without departing from the scope of the present invention. The following description of example embodiments is, therefore, not to be taken in a limited sense, and the scope of the embodiments of the invention is defined by the appended claims.

The functions or algorithms described herein may be implemented in software or a combination of software and human implemented procedures in one embodiment. The software may consist of computer executable instructions stored on computer readable media such as memory or other type of storage devices. Further, such functions correspond to modules, which may be software, hardware, firmware or any combination thereof. Multiple functions may be performed in one or more modules as desired, and the embodiments described herein are merely examples. The software may be executed in a Digital Signal Processor (DSP), Application Specific Integrated Circuit (ASIC), microprocessor, microcontroller, virtual controller system, or other type of processor operating in a computer system, such as a personal computer, server or other computer system.

Touchscreen displays and user interfaces may be implemented in various configurations, and may comprise one or more conductive layers to implement a touch sensor. The following discussion relates to mechanisms for testing a device having dual conductive layers, such as a mutual capacitance sensor device, having a driving layer and a sensing layer. These testing methods use the electrical characteristics and behavior of a dual layer configuration to provide an efficient test procedure. Although the testing methods and apparatuses disclosed herein are described with respect to a dual layer configuration in a touch sensor, the test methods and apparatuses are applicable to other configurations, including single layer and multiple layer configurations of capacitive traces in a sensing device. The techniques may also be used to test capacitive keyboards or other devices using capacitive sensors.

In one example, a touchscreen device is a capacitive position sensor having a two-layer electrode structure. Drive electrodes extend in a first direction on a first plane on one side of a substrate. Sense electrodes extend in a second direction on a second plane on the other side of the substrate so that the sense electrodes cross the drive electrodes at a plurality of intersections which collectively form a position sensing array. The capacitive position sensor acts a transducer. The capacitive position sensor is formed on a substrate having drive electrodes formed by conductive traces in a first layer, and sense electrodes formed by conductive traces in a second layer. The first layer is referred to as a driving layer and has drive electrodes extending in a first direction on a first plane. The second layer is referred to as a sensing layer and has sense electrodes extending in a second direction on a second plane. The spacing layer is positioned between the drive layer and the sensing layer. The sense electrodes cross the drive electrodes at a plurality of intersections in a third plane to form a position sensing array. Each crosspoint forms a capacitor between the driving layer and the sensing layer at that point.

Testing of such devices may be implemented to check for faults at various stages in production as well as in operation of a device. Faults in a device having one or more conductive layers may result from a break in the film from one or more of several causes. Faults include composition of a conductive trace, an increased resistance due to the conductive trace configuration, a short circuit between conductive traces, and so forth.

One type of test method implements a mechanical technique to test conductive films. Testing involves touching the assembled films and monitoring the resultant change in electrical properties related to mutual capacitance. A machine, such as a robotic arm may be used to apply the touch. The mechanical technique identifies some failures, but is slow and unreliable.

Some testing methods use an external electrode board designed specifically to measure sense signals for a given touch sensor. The test applies a test signal to individual electrodes of a driving layer and uses the board to measure received signals. The resultant measurements identify areas that are sensitive or prone to errors.

Optical techniques may be used to identify anomalies in a capacitive film, but this technique may only be relied upon to identify obvious failures. Still further, resistive techniques may be implemented to check for short circuit conditions between the lines of a capacitive layer. Resistive tests may be used to detect some conductive film failures. In a touch sensor device having an internal resistive divider positioned between drive electrodes, such as is used to spread the electric field, such an internal resistive member may be used to detect broken lines inside a conductive film.

The test mechanisms that follow may be used for a dual layer device to identify each of these types of problems efficiently. A device pass/fail result may be provided without the need to locate the individual failures.

To test a dual layer device, a test methods, apparatuses and systems are introduced which apply test signals to at least a portion of the traces of the driving layer and measure a corresponding response at the sensing layer. The test is done under various capacitive load conditions. Results may be compared to a target range of values. Testing may be done for an entire conductive trace, measuring behavior of the device in response to test signals applied to the trace. In one embodiment, multiple electrode pairs are measured concurrently without complex circuitry. The test may be used to measure mutual capacitance between layers, wherein the drive and sense electrodes are isolated and positioned in different planes of the device.

In some embodiments, a dual layer test method is implemented to identify errors or locate trouble spots in a module, both during production and after assembly. Such testing may be done during manufacture of the individual layers of a touch sensor, or may be done during troubleshooting to identify a point of failure. For a pass/fail test, detailed position location information may not be needed, as any fault point in a touch sensor results in a device fail. These testing mechanisms may be used to identify a broken trace or circuit within the touch sensor, such as a discontinuity in a film deposited on a layer of the touch sensor. Additionally, a test may identify increased resistance of a trace or circuitry, such as in a film or films of the touch sensor. Still further, the test may identify a short circuit condition within the touch sensor. These conditions are identified without the comprehensive testing of each point of mutual capacitance of the device.

A touch sensor may be manufactured within target specifications for performance consistent with the operation and use in a touchscreen display module. In order to ensure acceptable quality, testing involves simulating anticipated operating conditions. Often, the touch sensor is specified to operate within a minimum and a maximum voltage fluctuation on a range of touch events. Testing simulates these touch events to verify quality by measuring the touch sensor in a capacitive load state and in an ambient state. Test mechanisms for dual layer touch sensors, and other devices, may reduce the number of tests required by evaluating the quality of the touch sensor unit, such as touch sensor, by measuring all capacitive electrodes for a given driving line of the touch sensor. A reduction in the time used for testing each module results in shorter build times, and may reduce product cost.

FIG. 1 illustrates an example of a dual layer capacitive device 150 including a driving layer 155 and a sensing layer 153. The perspective of FIG. 1 is looking into the y-direction, with a horizontal x-direction and vertical z-direction. The driving layer 155 includes conductive traces to form drive electrodes 156, with conductive traces in the y-direction. The sensing layer 153 includes conductive traces to form sense electrodes 158, with conductive traces in the x-direction. A spacer 152 is provided to isolate sensing layer 153 and driving layer 155. In the dual layer structure, the sense electrodes (Y) 158 and the drive electrodes (X) 156 are not planar, but rather are deposited in separate layers of the substrate. As illustrated, a mutual conductance 159 is formed between the sensing layer 153 and the driving layer 155. A touch applied to a front panel 154, positioned over the sensing layer 153, changes the mutual capacitance of the electrode pair, 158 and 156, and thus changes the electrical characteristics of the device 150. As both the sense electrodes 158 and the drive electrodes 156 are in separate layers, these electrodes are accessible through the connectors for testing even after the device is assembled. In some embodiments a pin configuration of the assembled product includes pins to access the electrodes 156 and 158.

In one example, a test signal is applied to electrodes of the driving layer 155 when the conductive layer or film is in the ambient state. Measurements are taken at each of the sensing lines of sensing layer 153 to determine the mutual capacitance 159. This data is stored and identified as ambient data. In a next phase, the test considers behavior of the touch sensor 150 when a capacitive load is applied to the device to identify failure portions of a device. In this way, the touch sensor 150 is tested for an ambient state as well as a touch state. Some embodiments involve testing in multiple capacitive load states, and compare measurements taken for each capacitive load to a range of values. Some embodiments compare the results of the different capacitive load conditions to each other, and evaluate according to a relative change in electrical behavior of the touch sensor 150. The test may apply a ground loading as a capacitive load to the driving layer 155. The ground loading is applied to the touch sensor 150, including to the sensing layer 153. A fault is identified when a mutual capacitance value does not satisfy the target value. The target value may be a known range of capacitance values for a given capacitive load, or may be a comparative behavior of the device in a capacitive load state and while in an ambient state of the device. In some examples, the target value is a range of capacitances, a range of voltages, a range of currents, a measured time to charge a capacitor, or a range of non-dimensional digits, such as a ratio of input values to output values.

In some embodiments testing involves a process to charge a sampling capacitor using a charge transfer technique, wherein the voltage on the sampling capacitor is a function of the mutual capacitance. Testing involves charging the sampling capacitor to a reference voltage and measuring the time required, or the number of charge cycles used, to achieve the reference voltage. The time measurement is related to a change in capacitance of the device. In other words, the time to achieve a charged value on the capacitor is measured, wherein the time to charge the capacitor corresponds to a change in the electrical characteristic of the device, such as a change in a capacitance value within the device. For example, in some examples a QMATRIX™ sensor, by Quantum Research Group of Hamble, United Kingdom, enables measurement of a signal applied to the sensor by measuring the time for charging a sampling capacitor configured for testing the sensor. In one example, the process involves charging the sampling capacitor to a reference voltage using a charge transfer sequence, and then measuring a time to reach the reference voltage. The charge transfer is performed in a burst sequence of applied signals, referred to herein as a charging cycle or a burst cycle. The sampling capacitor is charged to a reference voltage, such as through a constant resistor. The charge is transferred to the sampling capacitor during the burst sequence. During each burst the sampling capacitor accumulates some portion of charge on the sampling capacitor, wherein the changes on each burst interval. In this way, the time measured for charging the sampling capacitor to a reference voltage is proportional to the mutual capacitance between electrodes. The charging time is a function of the electrical and physical properties of the sensor. Additionally, some embodiments, such as QPROX™ sensors by Quantum Research Group, Ltd. of Hamble United Kingdom, measure the number of burst cycles to charge the sampling capacitor to the reference voltage, wherein the cycle count corresponds to the electrical and physical properties of the sensor and may be used to identify or quantify a change in capacitance.

Figure 2:
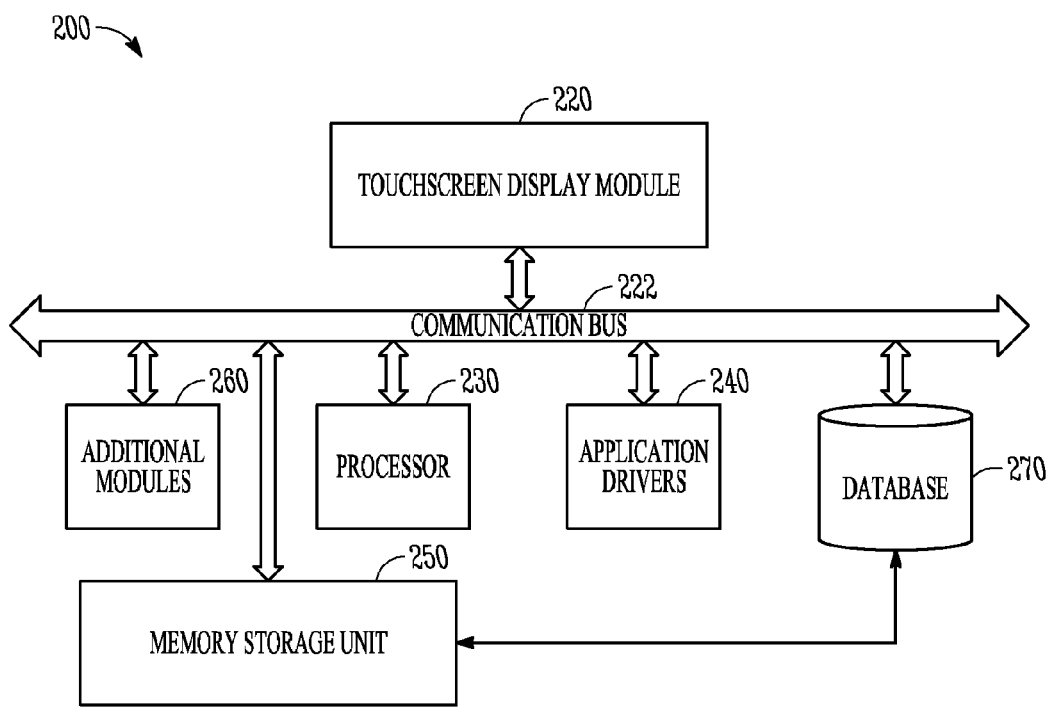
FIG. 2 is a block diagram illustrating a touchscreen display system, according to an example embodiment.

FIG. 2 illustrates a touchscreen display system 200, including a touchscreen display module 220, a processing unit 230 and application drivers 240. The touchscreen display module 220 receives user inputs in the form of touches to the display 220, and may also present visual images responsive to the processor 230, application drivers 240 and user inputs. The touchscreen display system 100 may further include a database 270 to store shapes and movement information for mapping received input actions with shapes, actions, data, and other information used to present the display images on the touchscreen display module 220, as well as to respond to commands associated with the user inputs. An optional set of additional modules 260 may be included in a touchscreen display system 200. Communications between modules and components within the touchscreen display system 200 may be facilitated by a communication bus 222. In some embodiments communications within the touchscreen display system 200 and with components external to the touchscreen display system 200 may be facilitated by wireless communications consistent with a wireless protocol. Some embodiments utilize a Wi-Fi wireless communication protocol as specified in the IEEE 802.11 set of standards for wireless communications.

The touchscreen display system 200 of FIG. 2 may be part of a touch sensor device using capacitive transduction for position detection, such as in a Personal Digital Assistant (PDA), cell phone, computer, game console unit, oven, washing machine, photocopier, Point Of Sale (POS) kiosk, Automated Teller Machine (ATM) and so others. The elements of the touchscreen display system 100 may be included in a touch sensor device, or may be distributed in modules that communicate with each other over a wired or wireless communication connection.

Figure 3:
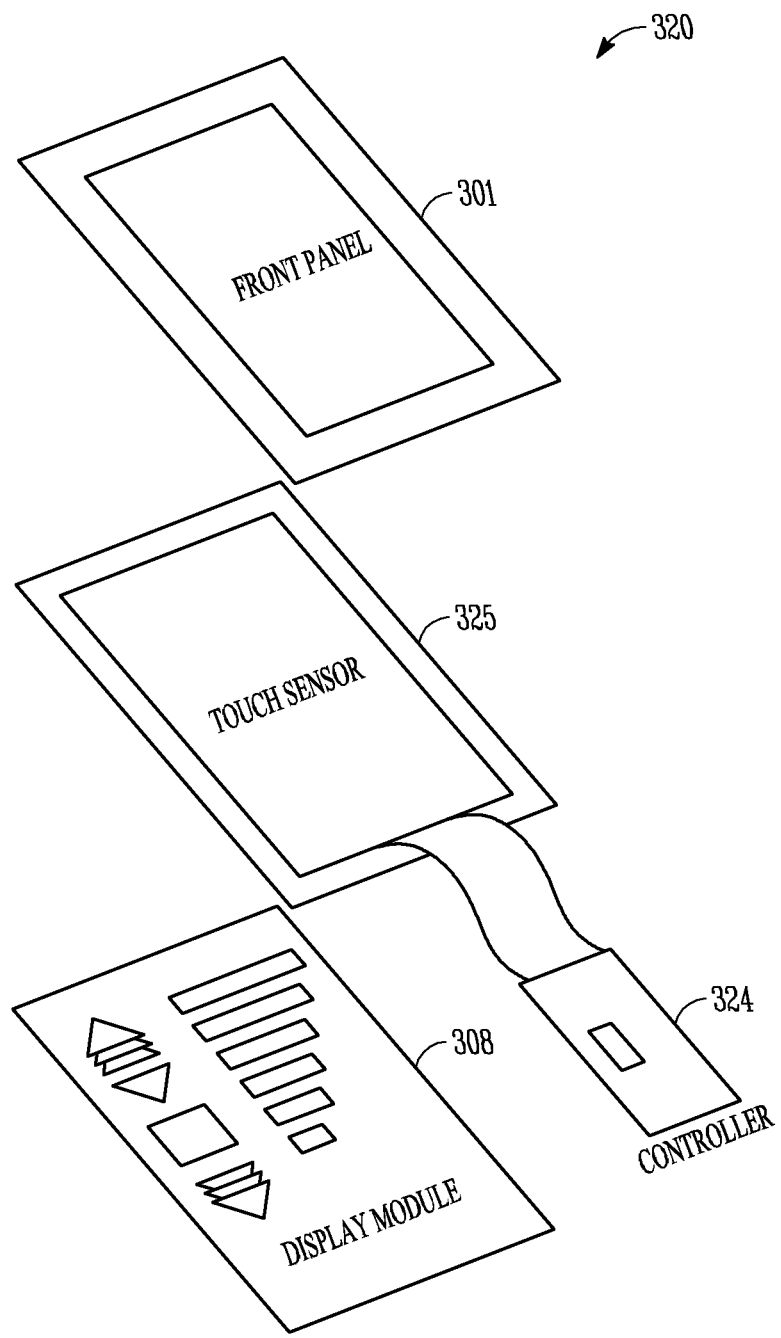
FIG. 3 is a block diagram illustrating a touchscreen display module, according to an example embodiment.

FIG. 3 further details an example of a dual layer touchscreen display module 320 in block diagram form. The touchscreen display module 320 has a display module 308 which includes the graphics for display to a user. The display module 308 includes information to be presented for display, such as a user interface display of a cell phone, having numbers for dialing and so forth. Within the touchscreen display module 320, a touch sensor 325 is positioned on top of the display module 308. The front panel 301 is positioned over the touch sensor 325 and provides the touch surface for use. The touch sensor 325 is further coupled to a controller 324 that uses the sensor 325 to measure the mutual capacitance at multiple points, and further to process the data of the touch sensor 325. The received signals are then evaluated by the controller 324 to determine if the received signals are within an acceptable range of values or violate a threshold value. In some embodiments multiple threshold values are used, such as to implement a high and a low threshold. The use of multiple threshold values identifies ranges of behavior. The touch sensor 325 and the front panel 301 comprise approximately transparent materials in one embodiment to allow user visibility of the display module 308. Thin conductive lines may also be used in further embodiments. In other words, as the touch sensor 325 and the front panel 301 are positioned over the display module 308, these components may be constructed such that a user is able to view the information displayed on the display module 508.

In one embodiment, touch sensor 325 is a dual layer structure having conductive traces deposited on substrate layers to form the electrode traces for driving lines of the driving layer and the electrode traces for sensing lines of the sensing layer. When a user touches the front panel 301, the touch changes the electrical characteristics of the touch sensor 325. The touch may result in a change to the capacitance between the driving and sensing layers, and thus changes the electrical and capacitive characteristics of the touch sensor 325. This change is typically seen at least around the touch point. The electrical characteristic change results in an electrical field change for the capacitive electrodes, which results in a capacitance change; the change in capacitance results in a change in the electrical relations of the electrode pairs, which may be measured and used to identify a location of the touch. In some embodiments, the capacitance is not measured, but rather changes in signal values received on the sense electrodes are measured. For example, the measured value may be the amplitude of the signal received on the sense lines of the touch sensor.

Figure 4:
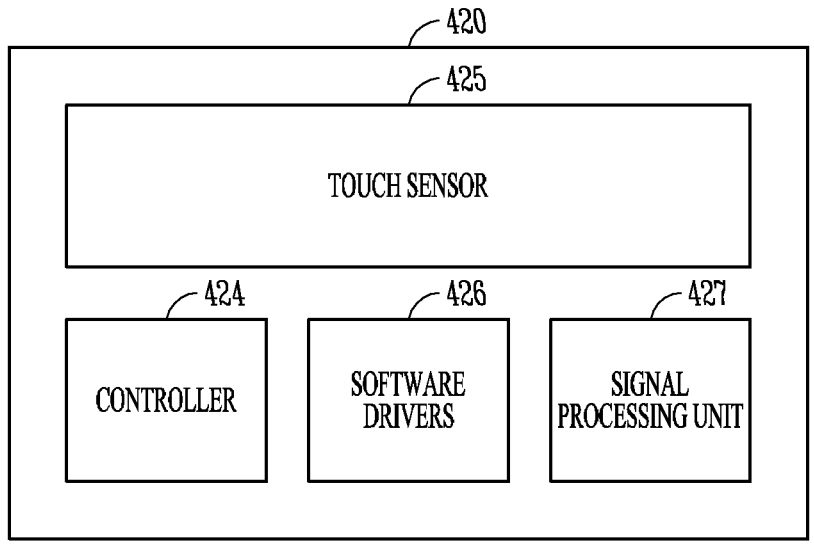
FIG. 4 is a block diagram of a touchscreen display module within a touchscreen display system, according to an example embodiment.

FIG. 4 illustrates a touchscreen display module 420, which is similar to the touchscreen display module 320, including components of a touchscreen type display. The touchscreen display module 420 includes a touch sensor 425, a controller 424, and a signal processing unit 427. In FIG. 4 the touchscreen display module 420 may optionally include one or more software drivers 426. The touchscreen display module 420 may further include additional memory or computational units consistent with a specific application. Also, the components of the touchscreen display module 420 may be implemented in a single modular unit, such as an ASIC, or may be an assembly of separate units. The touchscreen display module 420 functions as a mutual capacitance transducer, and provides a user input and a user interface to a system or application. The touchscreen display module 420 functions as an input device, similar to a mouse, stylus or keyboard. The touch sensor 425 comprises a dual layer configuration which may be tested using a dual layer test method to provide efficient testing and troubleshooting the operation of the device, both in a touch sensor, as well as in other substrate designs for various applications.

The controller 424 of the touchscreen display module 420 processes the information received through the touch sensor 425 according to a set of instructions. In one example, a user may select options presented on the touch sensor 425, such as numeric button icons. The user selections are provided to the controller 424, which makes decisions, executes code, and implements routines in response to and based on the user selections. Further, inputs to the touch sensor 425 may be used to input information directly, such as to input a signature or draw a picture with a finger or stylus.

The controller 424 receives information from the touch sensor 425 and translates the received information into instructions and code understood by a computing device. In other words, the controller 424 not only controls operation of the touch sensor 425 for displaying information and responding to commands, but acts to interpret received inputs to transform touch event information into computer-readable data. In this way, the controller 424 may receive measurement information, analysis information, data signals, and other values received during the display and testing of the touch sensor 425. The controller 424 in one embodiment is used to implement a dual layer test of the touch sensor 420, and to transform received or extracted information into a computer-readable or computer-executable format.

In one embodiment, the software drivers 426 add functionality to the signal processing unit 427 and the controller 424 to supply drive signals to portions of the touch sensor 424, receive sensing signals from other portions of the touch sensor 424, and calculate a position based on the different sense signals seen for drive signals applied to different portions of the touch sensor 424. The controller 424 controls operation of the drive and sense signals, and the processing of these signals, in order to determine the position of an object, e.g., a finger or stylus, adjacent the touchscreen display module 420.

The software drivers 426 may also include software update information for a touchscreen display system, such as system 320 of FIG. 3, enabling the touchscreen display module 420 to collaborate and work together with other components of the touchscreen display system. The software drivers 426 include computer programs and code allowing high level computer programs to interact with hardware devices, which in this application includes at least the touch sensor 425. The software drivers 426 transform computer-readable instructions and code into data and instructions for implementing actions and operations with respect to the touchscreen display system 400, as well as transforming data representing touch event information into information for use by higher level applications within and external to the touchscreen display system.

Figure 5:
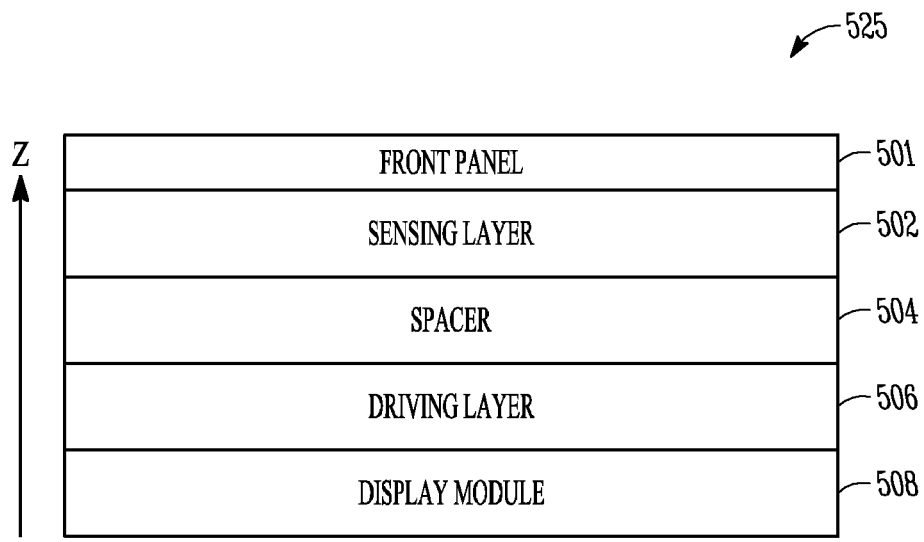
FIG. 5 is a block diagram of layers included in a touch sensor of a touchscreen display module, according to an example embodiment.

FIG. 5 illustrates an example embodiment of a touch sensor 525, which may bee similar to touch sensor 425 of FIG. 4. In FIG. 5, the touch sensor 525 comprises multiple layers, referred to as a stack, and is illustrated as positioned with respect to a z-axis. For clarity of this discussion, the axes may be referred to as x, y and z. Other embodiments may implement other configurations, relations, and perspectives. The touch sensor 525 comprises a display module 508, a driving layer 506, a spacer layer 504, a sensing layer 502, and a front panel 501. The display module 508 provides the display information to be viewed by a user, and serves as a reference for identifying the significance of the user's touch. The display module 508 includes graphic elements representing the keys, cells, and other graphic areas of the touchscreen display module 520. Some embodiments may provide the driving layer 506 and the sensing layer 502 in other configurations.

As the display module 508 is positioned at the bottom of the stack of layers making up touch sensor 525, the upper layers are designed so as to maintain visibility of the graphics of the display module 508. In some embodiments, the upper layers are required to be transparent, or approximately transparent. Some embodiments may reproduce the display module graphics on the front panel 501.

In some embodiments, the driving layer 506 is above the display module 508, and is positioned farther from the front panel 501 than the sensing layer 502, to allow isolation of signals. In some embodiments, the driving layer 506 and the sensing layer 502 each comprises a glass layer with a textured coating applied across the glass face (not shown). The coating forms conductive traces to implement the driving and sensing functionality. The spacer layer 504 comprises a material which electrically isolates the driving and sensing layers. In some embodiments, the organization of the layers may position the driving layer under the sensing layer. In some embodiments, a scratch-resistant coating or layer is deposited or otherwise positioned on top of front panel 501, over the sensing layer 502 and the driving layer 506. In operation, a drive signal, such as an alternating current or voltage, is applied to the driving lines of driving layer 506. Electrical current runs through the device, resulting in a received sense signal on the sense lines of the sense layer 502. The change of the output amplitude of the received signal is proportional to a change in the mutual capacitance when input signals to the driving lines are stable.

When such a touch sensor is in an ambient state, (e.g., a state having no applied touch), the capacitance between a given drive line and a given sense line has a first capacitance value. On a touch event, such as a finger touching or coming proximate the touch sensor's touch surface, the capacitance has a second capacitance value, which is generally less than the first capacitance value. The difference between these two capacitance values may be used to determine if the touch sensor area is performing properly. Testing seeks to test all areas in order to confirm that the entire touchscreen is performing properly. In some embodiments, the test method involves measuring electrical behavior that is a function of the capacitance. For example, in some embodiments and touch sensor configurations, a touch event results in a decreased voltage signal received on the sense lines. This is due to the decrease in capacitance to ground due to the addition of a human touch, as there is a mutual capacitance between the conductive lines or wires of the driving layer and sensing layer. There is further a capacitance between each of the driving layer and the sensing layer to an electrical ground. By applying a ground loading to the driving layer the mutual capacitance between the driving layer and the sensing layer decreases, but the capacitance of the sensing lines to ground increases. Testing seeks to find a measure of the mutual capacitance or to find a related measure from which changes in the mutual capacitance may be understood.

Also in practice, a user may not necessarily touch the electrodes of a capacitive sensor, but rather touches or moves proximate to a touch screen overlaying the driving and sensing layers. Therefore, in some embodiments the test method expects to see a reduction in the sense voltage between the ambient state and the touch state. As used herein, the touch state may be considered a capacitive load state.

The point or position on the front panel 501 where the touch is applied corresponds to an electrode coupling of the driving layer 506 and the sensing layer 502. The change of electrical condition at the electrodes is used to calculate the coordinates of the touch point. Once the coordinates are known, a controller, such as controller 424 of FIG. 4, may then translate the touch into an instruction, such as to identify touch gestures to perform a click or drag operation. For example, a touch may be made with a user's finger, a stylus, or any other implement for applying a touch to the touch sensor in order to execute user actions or selections.

The conductive lines within the touch sensor 525 may be made of a material that is electrically conductive as well as effectively transparent. In some embodiments, the conductive lines are thin metal wires which are not transparent, however when the metal wires are very thin and spread out spatially over the substrate, the metal wires appear to be invisible. The display module 508 is at the bottom of the touch sensor 525 stack. Therefore, various materials may be used in sensing layer 502, spacer 504 and driving layer 506 to ensure the display module 508 may remain visible through front panel 501 for view by a user. Some embodiments use a tin-doped oxide, such as Indium Tin Oxide (ITO), as the ITO material offers a transparent and colorless material which may be deposited as a thin layer. An ITO film also exhibits electrical conductivity, satisfying the specifics of a touch sensor design. Some embodiments use other materials which provide the electrical conductivity to function as a touch sensor, while providing transparency so that the display module 508 remains visible. One embodiment uses a copper material deposited as a layer of very thin lines on touch sensor 525. In one embodiment, an aluminum-doped zinc oxide material is deposited as a layer on touch sensor 525.

In an example embodiment, touch sensor 525 implements a four (4) wire resistive model, where the driving layer 506 is a conductive layer made of a transparent conductive material, such as an ITO glass or film, and the sensing layer 502 is a conductive layer made of a transparent conductive material, such as an ITO film. The spacer 504 comprises several small spacer dots in one embodiment. In some embodiments, the spacer 504 is a material deposited over the ITO film. When the touchscreen display is operative, a charge is applied to the driving layer 506. In the ambient state, when no touch is applied to the touch sensor 525, a steady state electrical condition is maintained. The steady state condition has a set of corresponding capacitance values between the driving layer 506 and the sensing layer 502. The testing considers the various mutual capacitances between the electrode pairs. For example, in a touch screen having 8 driving lines and 6 sensing lines a testing method may include 48 measurements.

Figure 6:
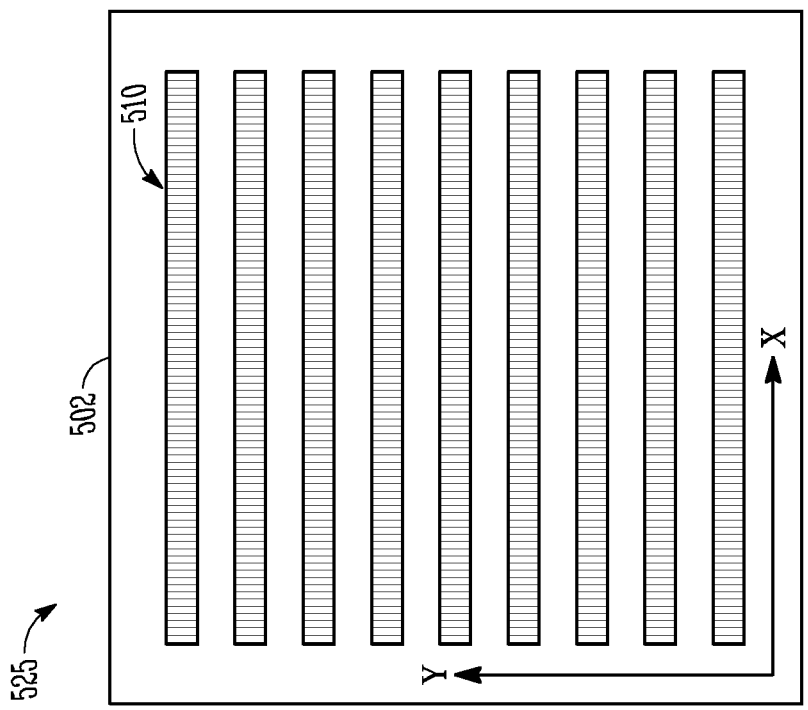
FIG. 6 is block diagram of traces in a sensing layer for use in a touchscreen display, according to an example embodiment.

FIG. 6 illustrates a sensing layer 502 of touch sensor 525 having a plurality of conductive traces, sensing lines 510. The sensing lines 510 are configured along the x-axis of the touch sensor 525. In one embodiment, the sensing lines 510 are uniformly spaced electrodes in a series of narrow lines running along an x-axis, which is 90 degrees to the y-axis and 90 degrees to the z-axis. The sensing lines 510 may be referred to as sense electrodes, y-electrodes, Y lines, receive electrodes or acquire electrodes. The sensing lines 510 are positioned throughout the display area of the display module 508. In one embodiment, the sensing lines 510 are narrow enough to be approximately invisible to a human eye, but wide enough to provide a resistance consistent with capacitive measurements.

Figure 7:
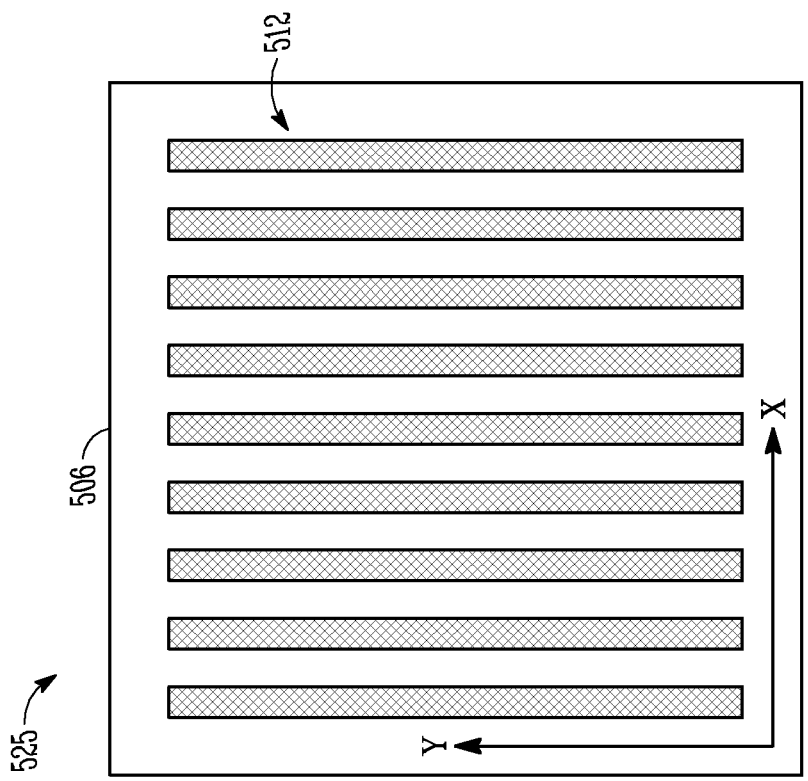
FIG. 7 is a block diagram of traces in a driving layer for use in a touchscreen display according to an example embodiment.

FIG. 7 illustrates the driving layer 506 positioned to complement and work with the sensing layer 510 to form a plurality of conductive electrodes. The driving layer 506 includes a plurality of conductive traces, driving lines 512. The driving lines 512 are configured along the y-axis of the touch sensor 525. In one embodiment, the driving lines 512 are uniformly spaced electrodes in a series of lines running along a y-axis, which is 90 degrees to the x-axis. In this way, the dimensions of the driving lines 512 are positioned to cross the sensing lines 510 in the z-plane, wherein the driving lines 512 are 90 degrees to the sensing lines 510 although they do not physically cross.

Figure 8:
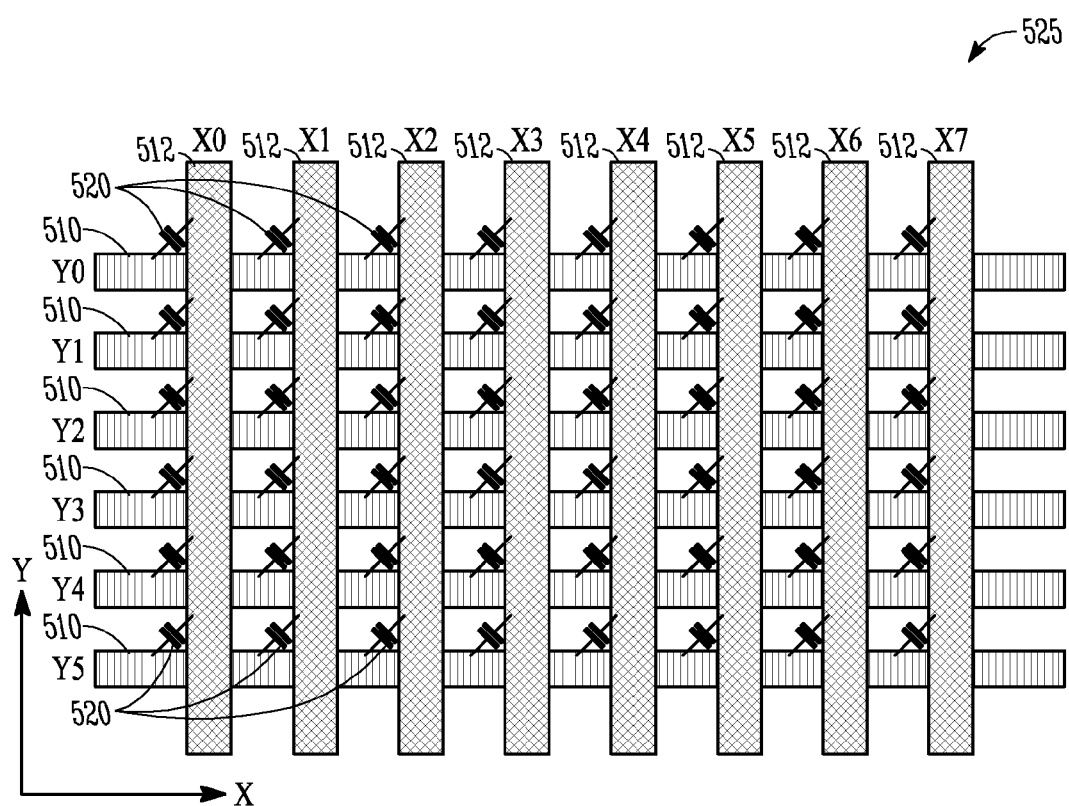
FIG. 8 is a block diagram of a configuration of traces for a sensing layer and for a driving layer, according to an example embodiment.

FIG. 8 illustrates the touch sensor 525 configuration showing crosspoints 520 within the orientation of the driving lines 512 of the driving layer 508 and the sensing lines 510 of the sensing layer 502. In one embodiment, the touch sensor 525, which is a dual layer capacitive sensor, has connections to drive electrodes (X) and to sense electrode (Y). The connections may be provided as one or more pins in an application module. The driving traces 512 along the y-axis are identified by X0, X1, through X15. The sensing traces 510 along the x-axis are identified by Y0, Y1, through Y5. FIG. 8 shows eight driving lines 512 and six sensing lines 510 as an example. The numbers of the driving lines 51 and the sensing lines 510 may vary. As shown in FIG. 8, each of the driving lines 512 crosses the sensing lines 510 at different x-y coordinates indicated by the crosspoints 520. Each crosspoint 520, corresponds to an electrode pair forming a capacitive element having a mutual capacitance, indicated by a capacitor symbol in FIG. 8. Each crosspoint 520 is mapped to a corresponding location on a display module, such as display module 308 of FIG. 3, such as to map to a location or area on the display module 508 of FIG. 5.

In FIG. 8, although there is no crossing in the z-axis, the sensing lines 510 and driving lines 512 form an array of mutual conductance because each of the sensing lines 510 crosses the driving lines 512 at x-y coordinates. As an example, consider the crosspoint 520 which identifies a crossing of driving line X7 and sensing line Y5. The mutual conductance between driving line X7 and sensing line Y5 represents the corresponding electrode pair formed at the crosspoint 520 between the driving layer 506 and the sensing layer 502. The behavior of the electrode pair identifies a touch at crosspoint 520 and may then be used to identify the corresponding x-y coordinates in the display module 508. In an ambient state, a residual mutual capacitance value describes the electrode pair.

Figure 9:
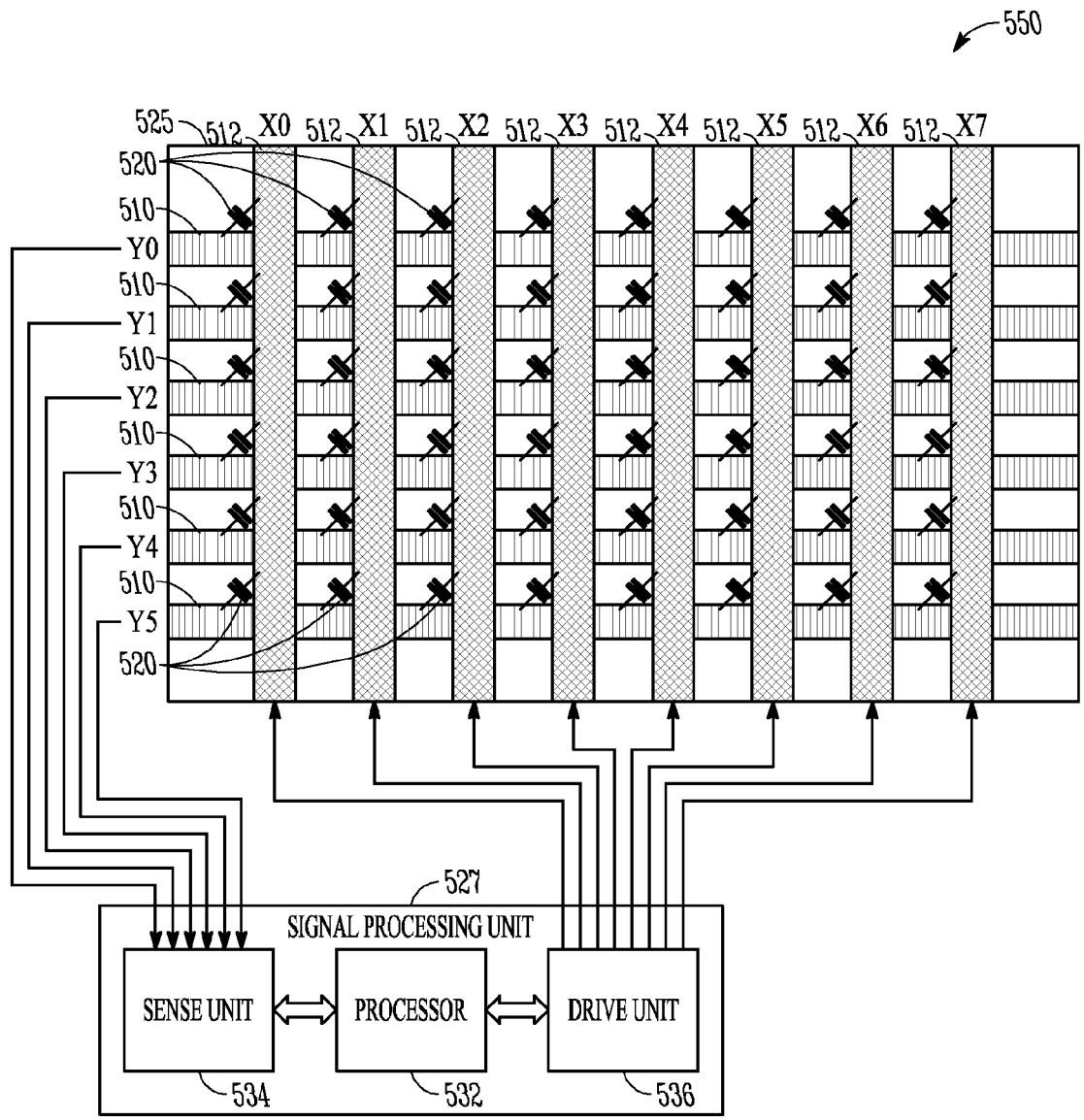
FIG. 9 is a block diagram of a configuration of components within a touchscreen display module, according to an example embodiment.

FIG. 9 illustrates a touchscreen display module 550 including the touch sensor 525 and the signal processing unit 527. Within the signal processing unit 527 a drive unit 536 provides active signals to driving lines 512. In some embodiments, the active signal may have a square wave form or other periodic waveform applied to the driving lines 512. In some embodiments, the active signal may be a unit pulse having a maximum amplitude A volts, and a period T seconds.

The signal processing unit 527 further includes a sense unit 534 to receive signals on the sensing lines 510. As illustrated, according to some embodiments, the sense unit 534 includes a connection to each of the sensing lines 510. In some embodiments, a switched connection (not shown) is provided to each of the sensing lines 510 individually. When a signal is received by the sense unit 534, the information is provided to the processor 532 to transduce the received signal into a user selection of an area displayed on the touchscreen display module 550. The signal processing unit 527 may be a single module such that the processor 532, the sense unit 534, and the drive unit 536 may be located in a single device or semiconductor chip. Similarly, the single processing unit 527 may include multiple modules, such that one or more of the processor 532, the sense unit 534, and the drive unit 536 may be located separately in different semiconductor chips or in separate devices. Some embodiments may distribute functionality in separate devices or as parts of other devices.

The driving lines 512 may be referred to as drive electrodes, x-electrodes, X lines, receive electrodes or acquire electrodes. In some embodiments, a subset of the driving lines 512 may be directly coupled to the signal processing unit 527, wherein the remaining driving lines 512 may be indirectly electrically coupled to the signal processing unit 524 through the subset of driving lines 512. The remaining driving lines 512 may be referred to as intermediate driving lines or interposed driving lines. As described previously with reference to FIG. 8, each of the crosspoints 520 identifies an electrode pair having a mutual capacitance. Testing to verify the performance of multiple crosspoints at one time avoids the need to test each individual capacitance value. Mutual capacitance sensors work on a principle called charge transfer, which uses a switched capacitor technique to assess the relative changes in a sensor's capacitance as it is touched. Testing involves simulating the condition a sensor experiences on touch. Effectively, charge transfer uses a sampling capacitor (Cs) to measure changes in the mutual capacitance (Cx) between two electrodes.

The sampling capacitor is used to accumulate the charge from the multiple charge transfers between Cx and Cs (where Cx is the mutual capacitance). The Cs is used to accumulate the charge transfers through Cx over a number of charge transfer pulses, and is used for the measurement. Testing works by applying a voltage pulse to one electrode and measuring a change in capacitance at another electrode for a variety of capacitive load conditions. The measurement then is used to determine changes in capacitance of the electrodes. By repeating the pulse multiple times, such as by providing an active signal to one electrode, a high resolution measurement system is realized that can detect changes in capacitance. In order to obtain stable and repeatable results, testing allows time for the voltage pulse to propagate through the electrode, and thus provide time to completely charge the electrodes.

The charge transfer technique avoids test methods which require a measurement of the voltage on the sampling capacitor Cs after every pulse or burst. The capacitance of the sampling capacitor Cs works like a memory cell and accumulates the resultant charge from each burst. In this way, it is possible to accumulate multiple results into the sampling capacitor Cs and then measure an accessible signal which is related to the capacitance of the sampling capacitor Cs. In some embodiments, such as a QMATRIX™ sensor, testing may measure the accumulated charge on the sampling capacitor Cs after each pulse or burst. Some embodiments measure the charge on the sampling capacitor Cs at the end of a burst sequence. In such embodiments, testing works by applying a voltage pulse to one electrode of the sensor (e.g. driving layer line), and then measuring the induced voltage on the other electrode (e.g., sensing layer line). The voltage of the sampling capacitor is proportional to the voltage on the sensing electrode. The resultant voltage, or reaction, is proportional to the mutual capacitance and the sampling capacitance, which remains constant. Testing may be performed for multiple capacitive loading conditions to simulate various touch events.

In an example embodiment, a test technique is used to measure the mutual capacitances for some or all of the driving lines 512 of touch sensor 525. These test mechanisms implement a reduced set of measurements over a variety of test conditions. While the sensing and driving lines 510 and sensing lines 512 are positioned in different planes of the z-axis, they have common crosspoints (e.g., crosspoints 520) in the x-y plane. Dual layer test methods effectively identify a fault at any of the crosspoints, such as crosspoints 520 (FIG. 8), by identifying changes in the electrical behavior of any of the driving lines 510 of touch sensor 525.

In an example embodiment illustrated in FIG. 8, the crosspoint 520 corresponds to a capacitor representing the mutual capacitance between trace X7 and trace Y5. Similar crosspoints are identified throughout the touch sensor 525. Testing measures electrical behavior, such as an increase or decrease in current through one of the traces, to identify faults at any location on the trace. These measurements may be done on an assembled device, as the driving lines may be accessible from external to the touchscreen display module 550, and these measurements do not require access to specific crosspoints on a same planar layer of the touch sensor 525.

The dual layer test techniques are applicable for testing a variety of devices and touch sensors, including products such as the QMATRIX™ parts. Such as parts numbered QT60240 and QT60160 provided by Atmel® of San Jose, Calif., as well as other touch sensor Integrated Circuit (IC) products. The ICs offering touch sensor functionality often employ transverse charge-transfer sensing electrode designs, where charge is forced from an emitting electrode into the overlying panel dielectric, and then collected on a receiver electrode which directs the charge into a sampling capacitor. The charge is then converted into digital waveforms. These techniques are also applicable to a distributed touch sensor design, where the driving lines (X) and the sensing lines (Y) may be implemented on different modules, ICs or chips.

Simplification of the test method for a dual layer touch sensor involves measurement and analysis. The measurement comprises measuring capacitances while the touch sensor is in the ambient state. The test method further comprises measuring capacitances while the touch sensor is in the touch state, or the capacitive load state. In some embodiments, a capacitive load is added to the driving layer.

Figure 10:
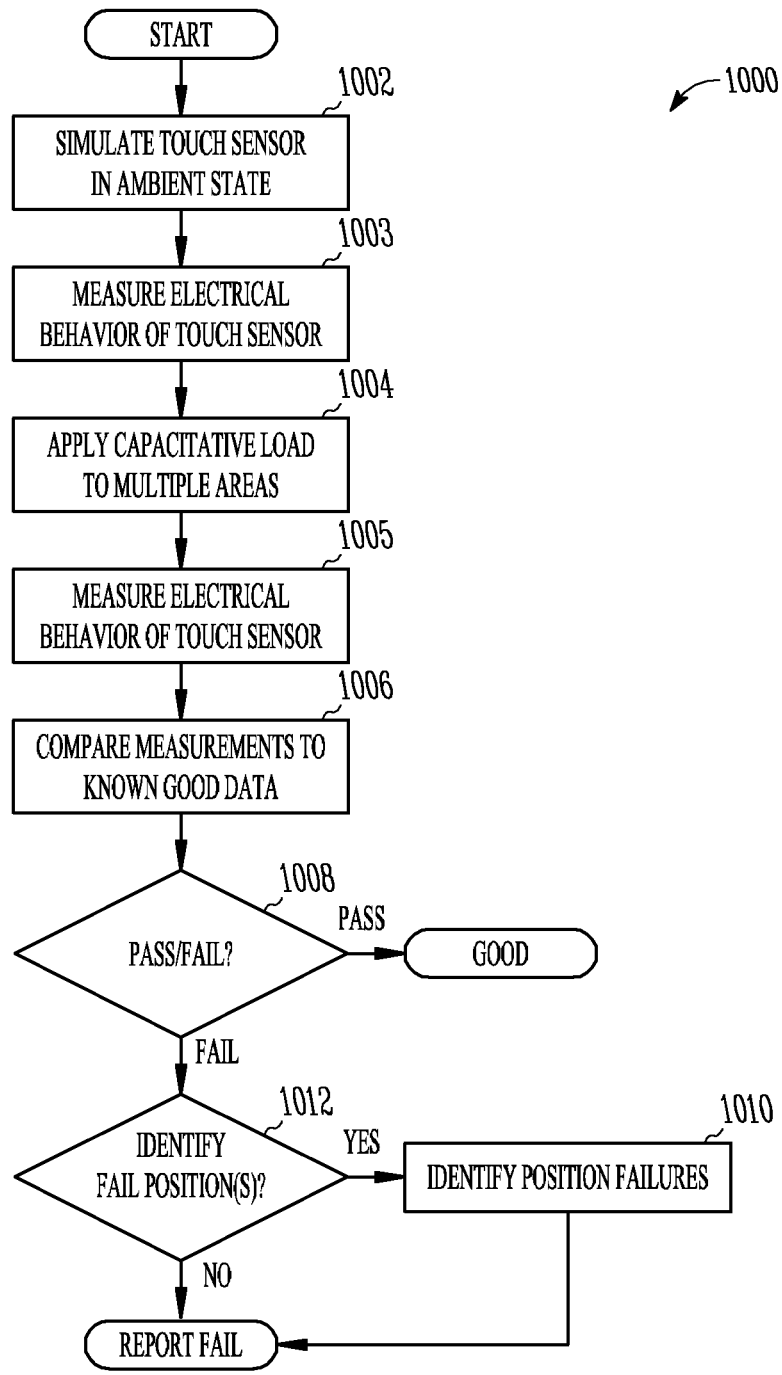
FIG. 10 is a flow diagram of a method for testing a touch sensor, according to an example embodiment.

The test method may involve testing each area corresponding to a display module, such as the display module 508 of FIG. 5., For example, the test method may measure the capacitance of each crosspoint, such as each crosspoint 520 in FIG. 8 and FIG. 9. FIG. 10 illustrates a flow diagram for a test method 1000, including activities 1002 to simulate a touch sensor, such as touch sensor 525 of FIG. 5 or touch sensor 425 of FIG. 4, in the ambient state. The test method 1000 also includes activities 1003 to measure the electrical behavior of the touch sensor 525 while in the ambient state. In one embodiment, the measurement is made by applying a test signal to at least one driving line of driving lines 512, and measuring the signals received at multiple sensing lines, such as to make a measurement at one end of a Y sense line as illustrated in the connection of the sense unit 534 of in FIG. 9 to an end of the Y sense lines. Some embodiments measure each sensing line individually. Some embodiments implement a parallel burst method to measure multiple sensing lines at the same time.

The test method 1000 further includes activities 1004 to simulate a touch state of the touch sensor 525, e.g., by adding a capacitive load to the touch sensor 525. In some embodiments, the touch state for touch sensor 525 is implemented by adding a capacitive load to all X driving lines or a subset of all X driving lines. The test method 1000 further includes activities 1005 to measure the electrical behavior of the touch sensor 525 in the touch state. Thus the test method 1000 includes testing the touch sensor 525 under various capacitive loads, including an ambient state and a touch state. The ambient state is the state of the device when no capacitive load is added to the touch sensor. The touch state is the state of the device when a capacitive load is added to the touch sensor. The capacitive load is designed to simulate a touch to the touch sensor, such as by a human finger. In some embodiments a touch sensor is designed to be touched by a variety of tools, such as a stylus. In these embodiments, testing may involve multiple capacitive load conditions to simulate the anticipated uses. In activities 1006 of FIG. 10, test measurements, or test results, are compared to known good data and values. The known good data may be obtained according to product specifications.

In one embodiment, the measured values are used to calculate a path resistance for a given electrical circuit path in the touch sensor. The calculated resistance value may be compared with known good values or may be compared relative to other paths in the touch sensor, such as to identify a path of high resistance. In some embodiments, voltage measurements are made for the sensing lines, and are compared with a voltage range corresponding to known good values.

The known good values described above may be determined by evaluating a number of measurements taken on touch sensors that perform well, or may be calculated as a function of the physical configuration of the touch sensor. The measured data is then evaluated for conformance to a range of values corresponding to a properly functioning touch sensor in the ambient state. In some embodiments, one or more threshold values is may form a range of values. In one embodiment, values between a minimum mutual capacitance value and a maximum mutual capacitance value correspond to a good film. The minimum and maximum value may be voltage values or current values, depending on the measurement type selected for test method 1000.

The test results are compared to known good data according to the following:

$$AMBIENT\_MAX \geq MUT\_CAP \geq AMBIENT\_MIN, \quad (1)$$

with the AMBIENT_MAX given as a maximum capacitance value while the touch sensor is in the ambient state. The AMBIENT_MIN is given as a minimum capacitance value while the touch sensor is in the ambient state. And the MUT_CAP is given as the calculated capacitance of the touch sensor based on the measured electrical behavior the touch sensor is in the ambient state. A device evaluates 1008 as a pass when the calculated mutual capacitance satisfies Equation (1), and the touch sensor 525 is thus identified as a good device. A device evaluates as a fail when results do not satisfy Equation (1), the device is failed and a "report fail" is made.

The method 1000 may include optional activities 1012 to identify a fail position or area of the touch sensor. When it is determined to identify a fail position of a failing device, the method 1000 may use a variety of mechanisms and techniques using the evaluated data. For example, the test method 1000 may include activities to repeat testing by applying a test signal to the driving lines and measuring a response on the sensing lines while the touch sensor is in multiple capacitive load states. This may include applying different capacitive loads concurrently to different driving lines. Similarly, this may involve calculating electrical characteristics of the touch sensor, such as an internal resistance, a mutual capacitance or other measurement.

The capacitive load state measurements are also compared to known good data for the capacitive load state. Additionally, the capacitive load state results may be compared to the ambient state results. In one embodiment, a capacitive load state is provided by grounding all of the driving lines 512. In such a capacitive load state, there is an expected drop in signal value received on the sensing lines 510. If an area of the touch sensor 525 does not experience this drop in the received signals the area is considered a fail point.

Figure 11:
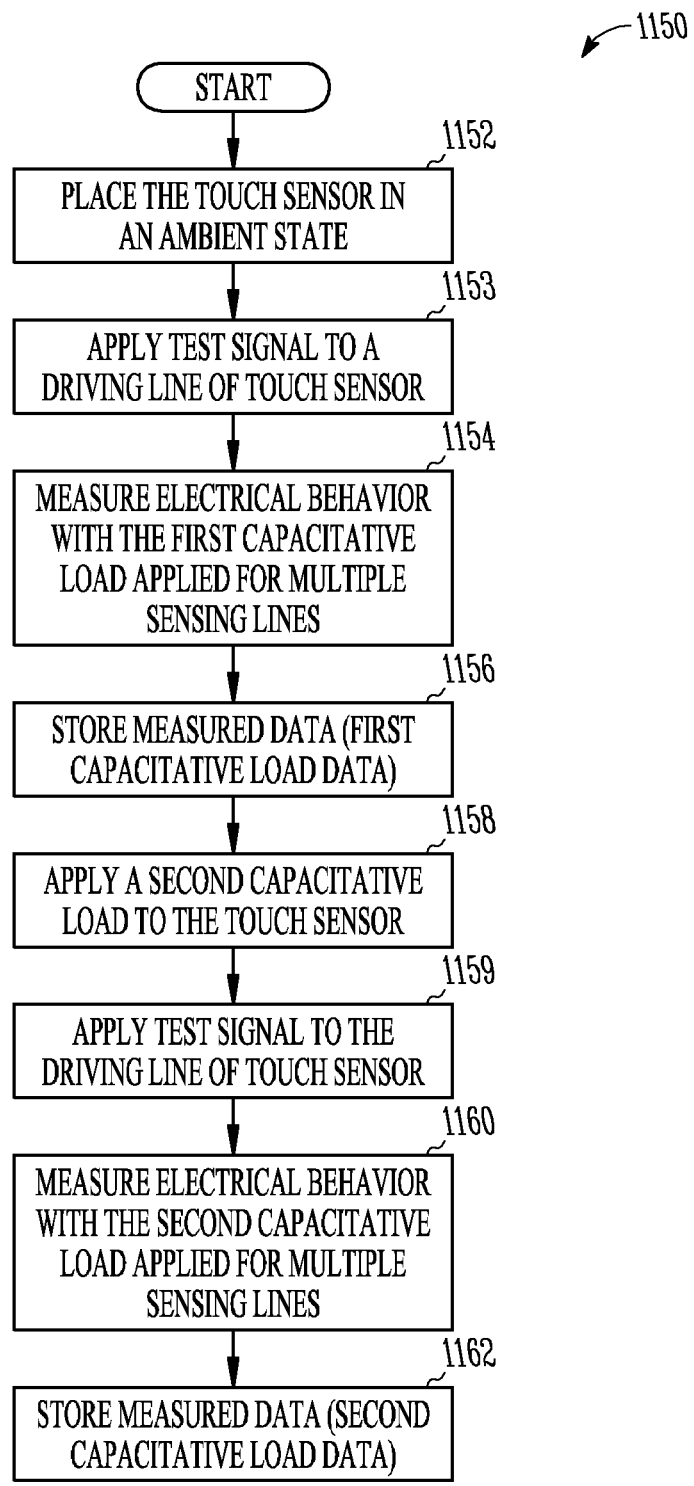
FIG. 11 is a flow diagram of a method for testing a touch sensor, according to an example embodiment.

FIG. 11 illustrates application of the test method 1100 to test of a dual layer device including touch sensor 525 (FIG. 5) having the configuration of driving lines 512 and sensing lines 510 as illustrated in FIG. 9. The test method 1150 includes activities 1152 to place the touch sensor 525 in an ambient state. The ambient state has no capacitive load applied to the touch sensor or dual layer device, simulating the touch sensor when no touch is applied. In one embodiment, a same capacitive load is applied to each area of a touch surface of the touch sensor 525. The configuration of the touch sensor may be used to determine where to apply a given capacitive load. For example, as described below with respect to touch sensor 1500, a test method may apply a capacitive load to a subset of the driving lines to accommodate different touch sensor configurations.

Continuing with FIG. 11, in activities 1153 a voltage or test signal is applied to one of the driving lines 512 of touch sensor 525. The test signal may be a pulse train having a peak-to-peak voltage. In this example, the conductive traces form driving layers which are part of the driving layer 506, which uses an ITO film for conductivity. In activities 1153 a test signal is applied to each of the driving lines 512, which have an effective mutual capacitance with respect to sensing lines 510, wherein the test method 1150 may repeat activities 1153 for each of the driving lines 512. In activities 1154, a measurement is made to determine the electrical behavior of the touch sensor 525. In some embodiments, the measurements are made on all of the sensing lines. In some embodiments, the measurement is made for multiple but not all of the sensing lines. In some embodiments, when the test is performed on a completed module, such as a touch sensor chip, the pin out configuration may identify one or more contact points for providing an active signal to the driving lines 512 and receiving a signal from sensing lines 510. In activities 1156, the measured data is stored in a data array as capacitive load data. Some embodiments may optionally calculate a mutual capacitance or other value from the measured data. In activities 1156 the measured values are then stored in a data array for comparison to known good values.

The method 1100 further includes activities 1158 to apply a second capacitive load state to the touch sensor, and measure 1160 the electrical behavior of the touch sensor 525 for multiple sensing lines. The measurements are stored 1162 in a data array as capacitive load data. The stored values may include the measured electrical behavior, such as voltage or current measurements, and may include assumptions or conditions used in testing. The second capacitive load state may be implemented by applying a strong ground loading, or coupling the corresponding pins to a ground voltage. In one embodiment, a soft, conductive material is placed over the driving layer 506, such as a foam layer covered in copper, a conductive cloth or a low resistance film. The conductive material is then connected to a ground supply voltage. The conductive material having a resistance value that does not inhibit short charge pulses. The measured data may include voltage levels measured the sensing lines, or may include other measures.

The test methods 1000 (FIG. 10) and 1150 (FIG. 11), respectively, may be used to test a dual layer device, having separate conductive layers, where at least one layer includes an ITO film to provide conductivity and transparency, referred to as a 2-layer ITO screen. The pattern or formation of the dual layers is illustrated in FIG. 5, with traces illustrated in FIG. 9. As each of the driving layer 501 and the sensing layer 506, includes a conductive film, the measurement of these layers actually measures the traces formed by the capacitive layers and therefore, measures the conductive film. By testing under various conditions, a comparison of performance under such conditions provides information as to how the device will perform in practice. As described with respect to test method 1150 of FIG. 11 an ambient state may be compared to a single capacitive load state. Some embodiments include testing of multiple capacitive load states, and may involve a portion of the display module 508. In these embodiments each of the mutual capacitances resulting from different capacitive load states has a corresponding relationship to the touch sensor configuration. In other words, the mutual capacitance may be determined by the test measurements at the sense layer.

The stored data, both ambient data and capacitive load data, is then available for analysis and comparison to identify not only failures within the touch sensor 525, but also to identify weak areas, strengths, and other considerations. For example, a design may incorporate additional reliability into areas of maximum use, such as a specific area on a display. In this case, the test may desire to evaluate performance of those measurements of test sensor 525 that are related to the high use areas of the display.

Figure 12:
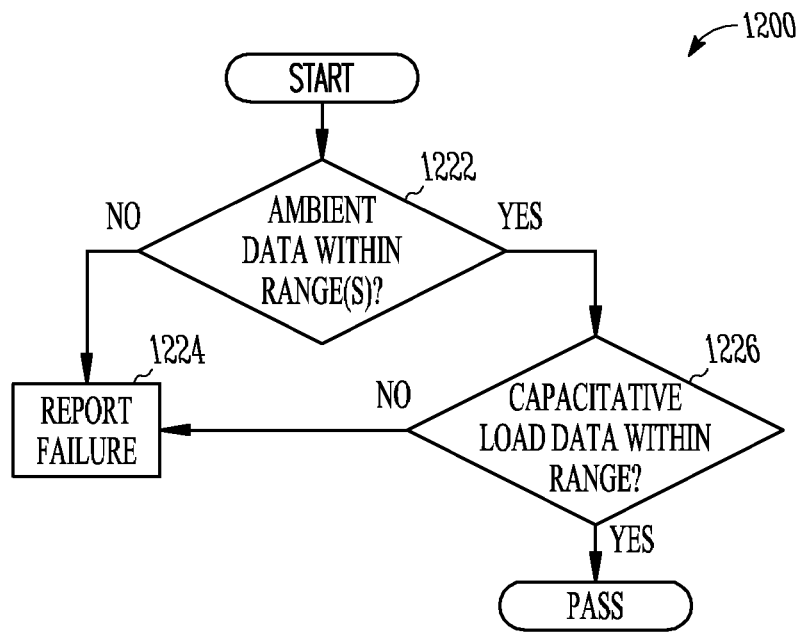
FIGS. 12 and 13 are flow diagrams of methods for evaluating measurement results from testing a touch sensor, according to an example embodiment.

After the measurement data is obtained, the data may be used to evaluate the performance of the touch sensor 525. FIG. 12 illustrates a method 1200 including activities 1222 to determine if the ambient state data, which may be referred to as the ambient data array when stored in memory as an array, is within a specific range or values and does not violate an assigned threshold. Any measurement which violates the assigned threshold results in a report 1224 of the failure. In other words, the method 1200 verifies that the device under test performs approximately consistently with a known good device. Typically, a known good device or film provides a minimum mutual capacitance value and a maximum mutual capacitance value.

When the ambient state measurements are within range, the method 1200 then includes activities to determine 1226 if the capacitive load data is within the specified ranges and does not violate the assigned thresholds. When a threshold is violated, a report 1224 of failure is generated; however, when the capacitive load data values are within a designated range of values, the touch sensor 525 passes the test. Some embodiments also include an identification of a measured level for one or both of the capacitive load states. According to an example embodiment, a test mechanism then compares the ambient data to the capacitive load data to identify a comparative relationship between the two test states.

Analysis of the measured and stored data or information provides information as to the performance of a touchscreen device. In an example embodiment, a range of target values to use in evaluating test measurement may be determined by evaluating a number of devices and finding the etalon values. Etalon values for measurement are those falling within a designated portion of the Gaussian distribution describing the measurements. The values falling within the designated portion of the Gaussian distribution determine the range of values. The range values, such as etalon values, may then be stored into two arrays, one for ambient data and one for capacitive load data. For a given cell, or measurement point, the capacitive load data is compared to the ambient data.

The ground loading is expected to have a corresponding drop in signal values, and therefore, the capacitive load state measurement values are expected to be less than the ambient state measurement values. The comparison between the ambient state measurements and the capacitive load state measurements may utilize an absolute difference or range between the two states' measurements. In this way, the ambient state measurements are evaluated and confirmed to exceed a threshold difference or delta value. One consideration of testing is to ensure that the measured values are consistent across the device under test, as this allows identification of trouble or fault spots. For example, a small difference between the ambient state and capacitive load state measurements may indicate a missing or broken ITO film or trace. Similarly, such a comparison of ambient state measurement to capacitive load state measurement may identify a change in resistance within a portion of the touch sensor. The change in resistance exhibits a small or possibly immeasurable change in the capacitive load state for a given measurement, but may be identified in comparison to other measurements of the touch sensor. The test method may include a variety of analysis types to identify faulty performance.

Figure 13:
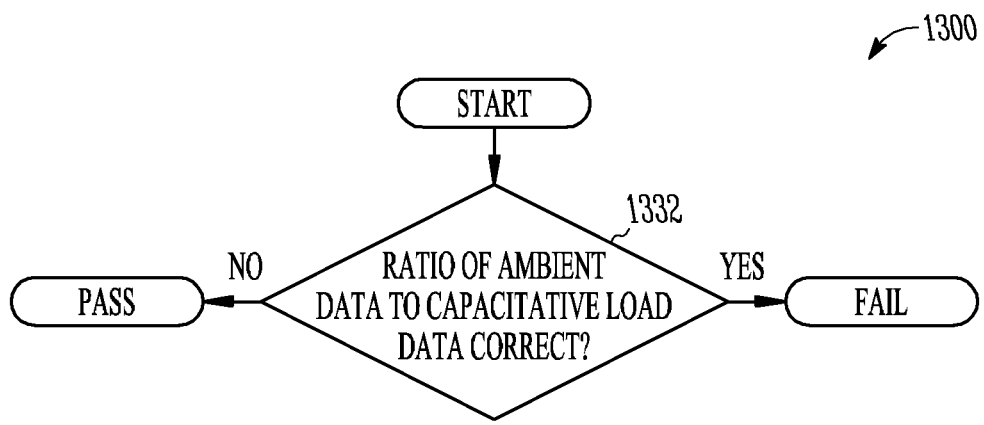

FIG. 13 illustrates a method 1300, including activities 1332 to compare the ambient data with the capacitive load data for consistency. When the capacitive load data is within an designated range of the ambient data, the device passes; however, if any of the data violates the designated range, the device fails. In one embodiment, the known good device measurements are stored in the memory storage, such as database 270 of FIG. 2.

The methods of FIGS. 11, 12 and 13 provide an indication as to the viability of the device under test in operation within a touchscreen device. The testing methods and techniques presented may be implemented with minimal test equipment, and may be performed after the touch sensor is fabricated into a final product or application board.

Figure 14:
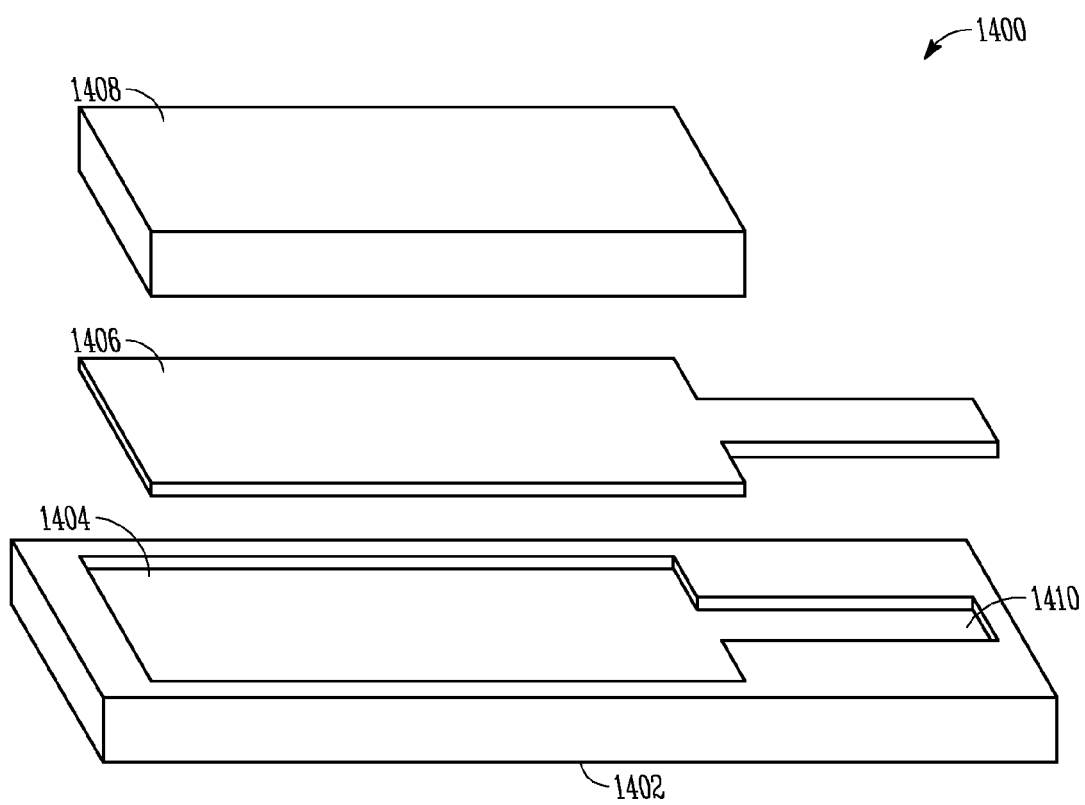
FIG. 14 is a block diagram of a test configuration for testing a touch sensor, according to an example embodiment.

Dual layer test methods may implement a test system as illustrated in FIG. 14 to evaluate a device 1406, such as touch sensor 525. The test apparatus 1400 includes a base plate 1402, which may be made of a dielectric material. The base plate 1402 is used to position a device under test 1406 within a position frame shape 1404, which complements the shape of the device under test 1406, and provides a connection to the controller portion, such as controller 324 of FIG. 3. In one example, the base plate 1402 includes a cutout portion to allow coupling of a controller portion of the touch sensor to a test machine or to a touch sensor controller. The test apparatus 1400 further includes an upper cover 1408, such as a conductive foam cover 1408. During a test, the device under test 1406 is placed into the test apparatus 1400. The device under test 1406 may be a single layer of a composite chip or may be a single layer of a touch sensor 525, such as sensing layer 502 or driving layer 506, as illustrated in FIG. 5. The position frame shape 1404 is designed to receive the device under test 1406 and may be dynamically adjusted to accommodate a variety of device shapes and sizes. A conductive foam cover 1408 is provided for insulation and grounding of the device under test 1406.

Such testing uses measurement results from a known good device, such as a device having been previously qualified. The known good results are used as a qualification threshold. Some embodiments apply a same threshold value to all measurements while the touch sensor is in a given state. Some embodiments apply different thresholds to different measurements for a given state, such as for individual sense lines or groups of sense lines. A touch sensor passes the test when the measured values do not violate the assigned thresholds. In one embodiment, a testing circuit includes signal drivers to provide inputs to the touch sensor traces, as well as provides an interface to a computing device or component to analyze the resultant measurements. Test equipment may simulate various elements of an operating environment, or may simply isolate one electrical behavior of a touch sensor.

In one example, the device under test 1406 is positioned within the base plate 1402. The test system 1400 implements activities to take sense line measurements in the ambient state and in the capacitive load state. The ambient state may be measured without THE use of the cover 1408. The test system 1400 may be configured to accept a variety of devices having different sizes, shapes and configurations.

The base plate 1402 includes a connection portion 1410, which enables connections to supply test signals to the driving lines and receive signals from the sensing lines of a device under test. In one embodiment, the connection portion 1410 is adapted to couple to a controller for a touch sensor, such as controller 324 of FIG. 3. In an alternate embodiment, the base plate 1402 is shaped in an alternate shape to accommodate a finished product.

In one example, a finished product including the touch sensor 525 has a configuration as in FIG. 8 or 9, and an IC package with pins allowing access to driving lines and sensing lines such as in touch sensor 525. The test method 200, and others, may be implemented by providing the capacitive load via the pins corresponding to the driving lines.

The test system 1400 of FIG. 14 may adapt to incorporate different conductive foam covers to implement two different capacitive load states, where the shape of the different conductive foam covers implements the capacitive load states. The cover 1408 is shaped to provide a same capacitive load to multiple driving lines of a touch sensor. The cover 1408 of FIG. 14 is also shaped to accommodate a test which applies a common ground condition to all of the driving lines 512 of touch sensor 525 (FIG. 9).

A test system similar to test system 1400 may apply loading to the pins coupled to the driving lines (e.g., X pins) and receive measurements via the pins coupled to the sensing lines (e.g., Y pins) so as to test a touch sensor. Such testing may be performed with a simplified test structure and may be implemented into a test procedure of a touch sensor in an IC package, such as by a semiconductor or IC test platform. Such testing positions the device to access each pin, and has capability to drive voltage and active signals into the touch sensor as well as to receive measurements on various pins.

Some dual layer devices are built in a variety of shapes and the individual traces of the drive layer 506 and the sense layer 502 may be in a variety of configurations. As touch screen displays come in a variety of sizes, the number of driving and sensing lines or electrodes may implement a variety of configurations and designs. For example, as the size of the display area increases, the number of driving lines may become difficult to package, and therefore, some internal combinations and configurations may be implemented.

Figure 15:
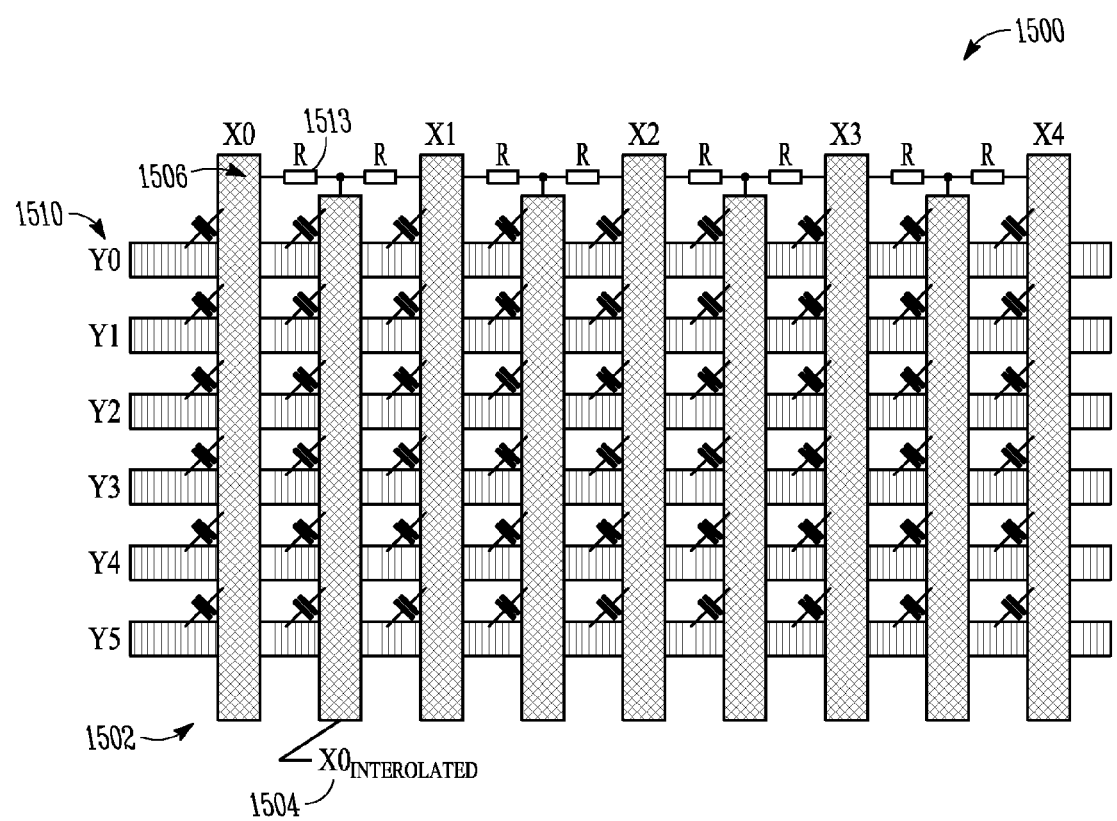
FIG. 15 is a block diagram of a configuration of active and interpolated traces for a driving layer configured with traces of a sensing layer, according to an example embodiment.

In one example, dual layer test methods and techniques are also applicable to configurations of a touch sensor 1500 illustrated in FIG. 15 having interpolated driving lines and sensing lines. The touch sensor device 1500 has a set of the driving lines 1512 are identified as a set of active electrodes 1502. Another set of driving lines 1512 are interpolated with the active electrodes and are referred to as interpolated electrodes 1504. The interpolated electrodes 1504 may be referred to as intermediate electrodes or resistive electrodes, as active signals are not applied to these lines directly, but rather are applied indirectly through a resistive chain 1506 from the active electrodes. The modification is made to accommodate a more compact design. The active electrodes 1502 and the interpolated electrodes 1504 are coupled together using the resistive chain 1506. The resistive chain 1506 includes a series of resistors 1513 positioned between an active electrode, such as X0, and an interpolated electrode, such as $X0_{INTERPOLATED}$. A signal applied to the active electrodes 1502 is seen attenuated at the interpolated electrodes 1504.

The dual layer testing mechanism adds additional measurement conditions by applying the at least one capacitive load state to the set of active electrodes 1502 and then to the set of interpolated electrodes 1504. Various example embodiments of the testing techniques for testing a touch sensor 1500, as in FIG. 15, are described with respect to FIGS. 16, 17 and 18. The first portion of testing is done while the touch sensor is in an ambient state. Test signals are supplied to the set of active electrodes 1502 in the ambient state, and the electrical behavior measurements are taken for the touch sensor 1500.

Figure 16:
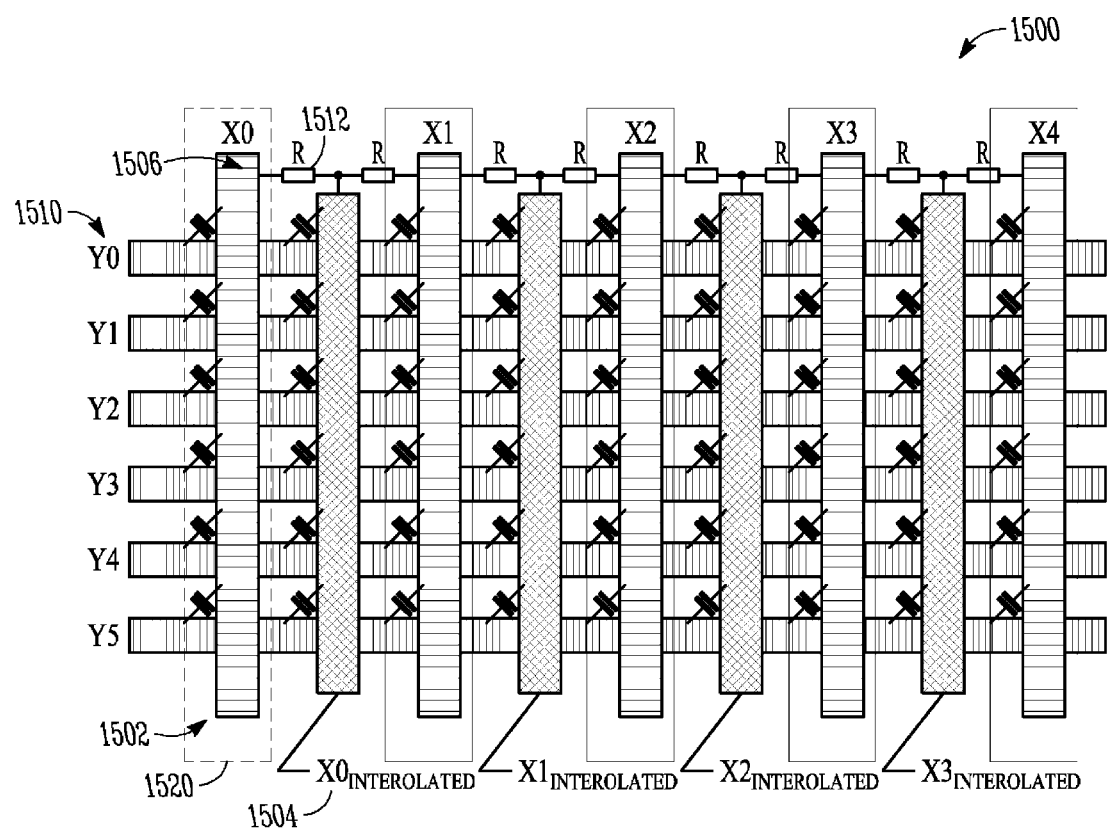
FIGS. 16 and 17 are block diagrams of test methods applied to a configuration of traces as in FIG. 15, according to an example embodiment.

A capacitive load is then applied to the set of active electrodes 1502, and a conductive foam cover connects with the touch sensor 1500 in the areas illustrated by the shaded areas 1520 of FIG. 16. As illustrated, the test signals are applied to areas 1520, including the set of active electrodes 1502 of driving lines X0, X1, X2, X3, and X4. Corresponding measurements are taken at the sensing electrodes 1510 corresponding to sensing lines Y0, Y1, Y2, Y3, and Y4. In this portion of the testing, the measured values illustrate the interaction produced between the active X electrodes 1502 and the acquiring or sensing Y electrodes 1510. The measured values are stored in a data array.

Figure 17:
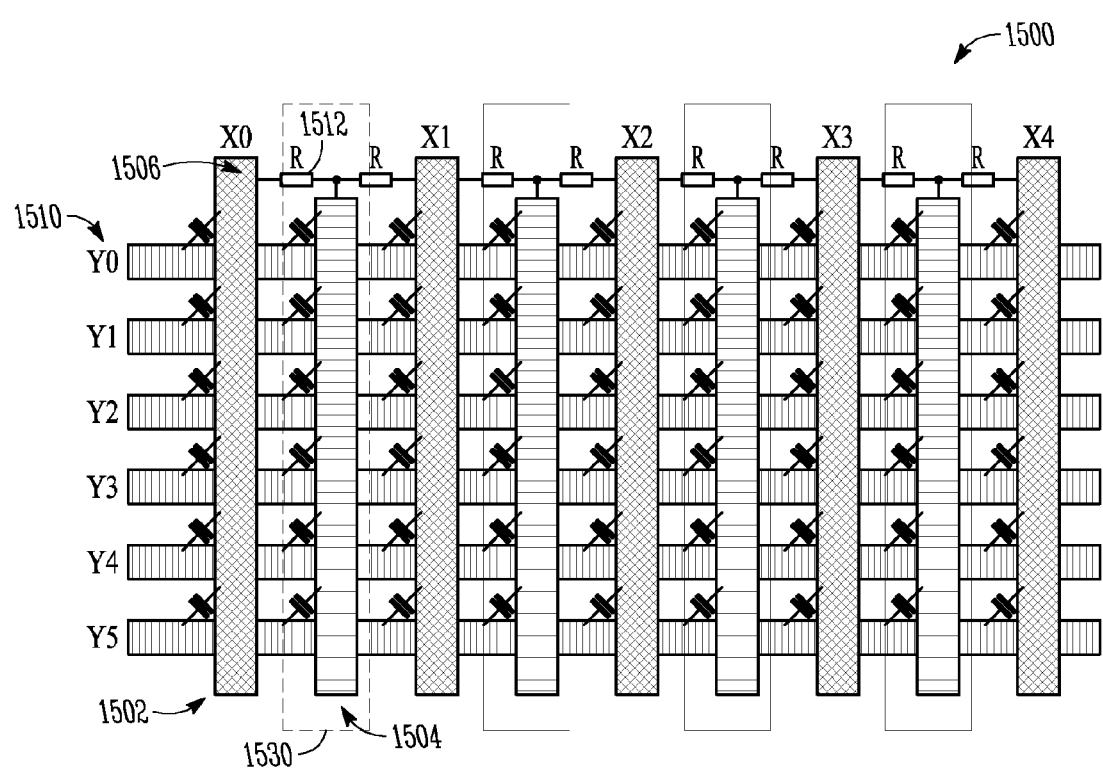

FIG. 17 illustrates the touch sensor 1500 identifying areas 1530, which are shaded, and which include interpolated electrodes 1504. Testing then applies the capacitive load, as previously applied to areas 1520, to the areas 1530, which represents the interpolated electrodes 1504 of driving lines identified by $XO_{INTERPOLATED}$, $X1_{INTERPOLATED}$, $X2_{INTERPOLATED}$, and $X3_{INTERPOLATED}$. This portion of testing applies a second conductive foam cover, which is shaped so as to contact the interpolated electrodes 1504. The measured values are stored in a data array.

Some embodiments may implement the conductive element as a circuit or a plate. Alternate mechanisms may be used to provide the active signals to the electrodes for testing. The active signals applied to the driving electrodes are determined so as to result in a reduction in the voltage of the measured signals at the Y electrodes 1510. The active signals therefore, are designed to impact the electric field in those areas which depend on the mutual capacitance between a given driving electrode and a given sensing electrode.

Figure 18:
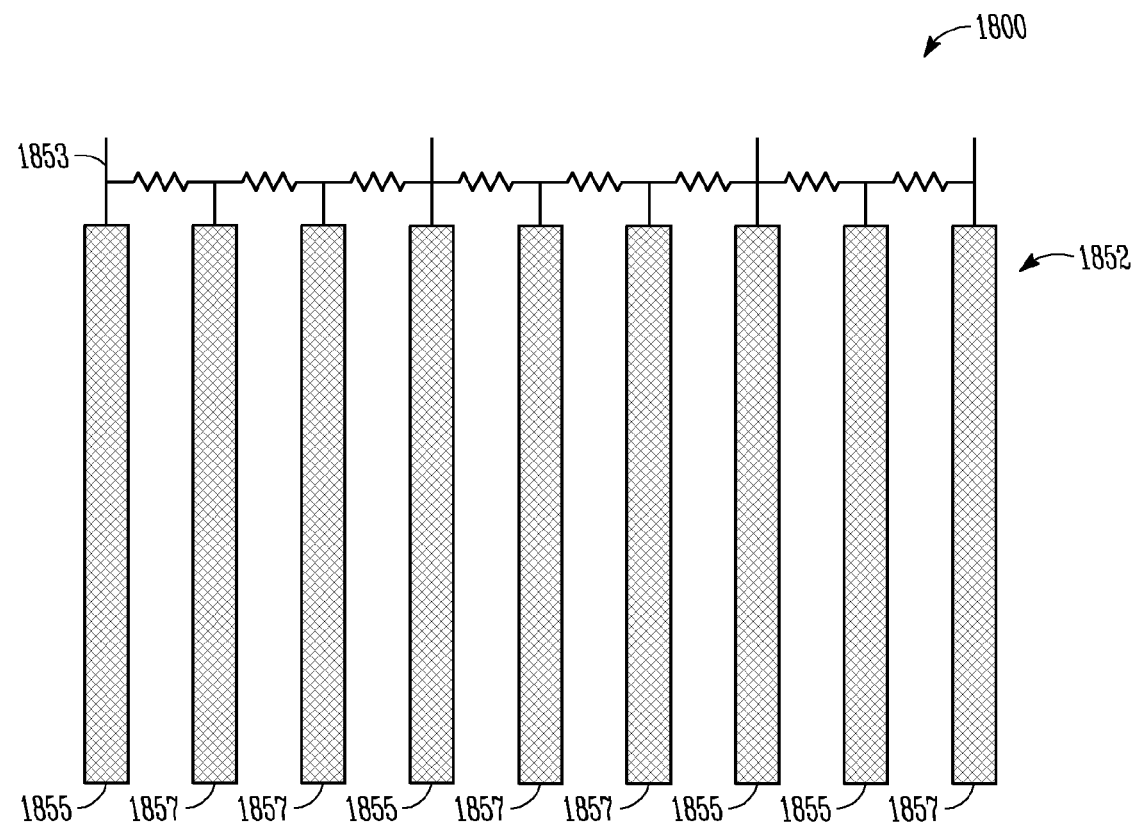
FIG. 18 is a block diagram of a driving layer of a touch sensor having interpolated electrodes, according to an example embodiment.

FIG. 18 illustrates an alternate configuration 1800 for interpolating electrodes of the driving layer. As illustrated, multiple driving lines 1852 are interpolated, and have a potential divider chain 1853 coupling the electrodes. In this example, active signals are driven to electrodes 1855, while electrodes 1857 receive a proportional signal. There are multiple interpolated electrodes 1857 positioned between the drive electrodes 1855, such as two consecutive. Although the arrangement of touch sensor 1800 is similar to that of touch sensor 1500, each configuration of driving lines and voltage divider mechanism has a corresponding range of acceptable values for mutual capacitance of the device. In each of these configurations there is an expected drop in the received sense signals in a capacitive load state as compared to a ambient state.

Figure 19:
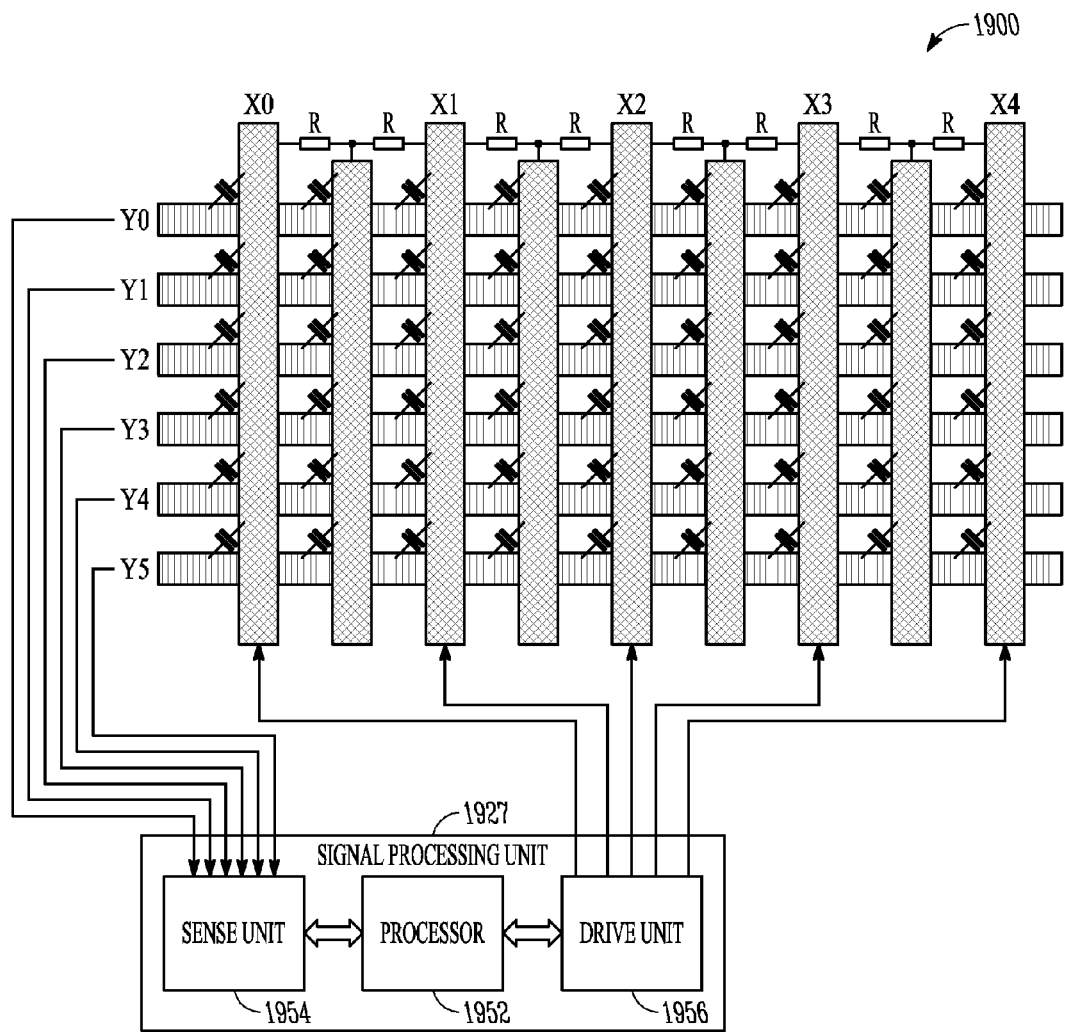
FIG. 19 is a block diagram of a configuration of components within a touchscreen display module, according to an example embodiment.

FIG. 19 illustrates a system, 1900 including a touch sensor 1900 having interpolated drive electrodes. The signal processing unit 1927 includes a sense unit 1954, a drive unit 1956 and a processor 1952. The sense unit 1954 receives signals from the sensing layer of touch sensor 1900. The drive unit 1956 provides active signals to at least some of the electrodes (e.g., X0, X1, X2, X3 and X4) in the driving layer. As illustrated, the active drive signals are provided directly to a first set of drive electrodes, and are provided to the other drive electrodes by way of a proportional voltage divider circuit.

Figure 20:
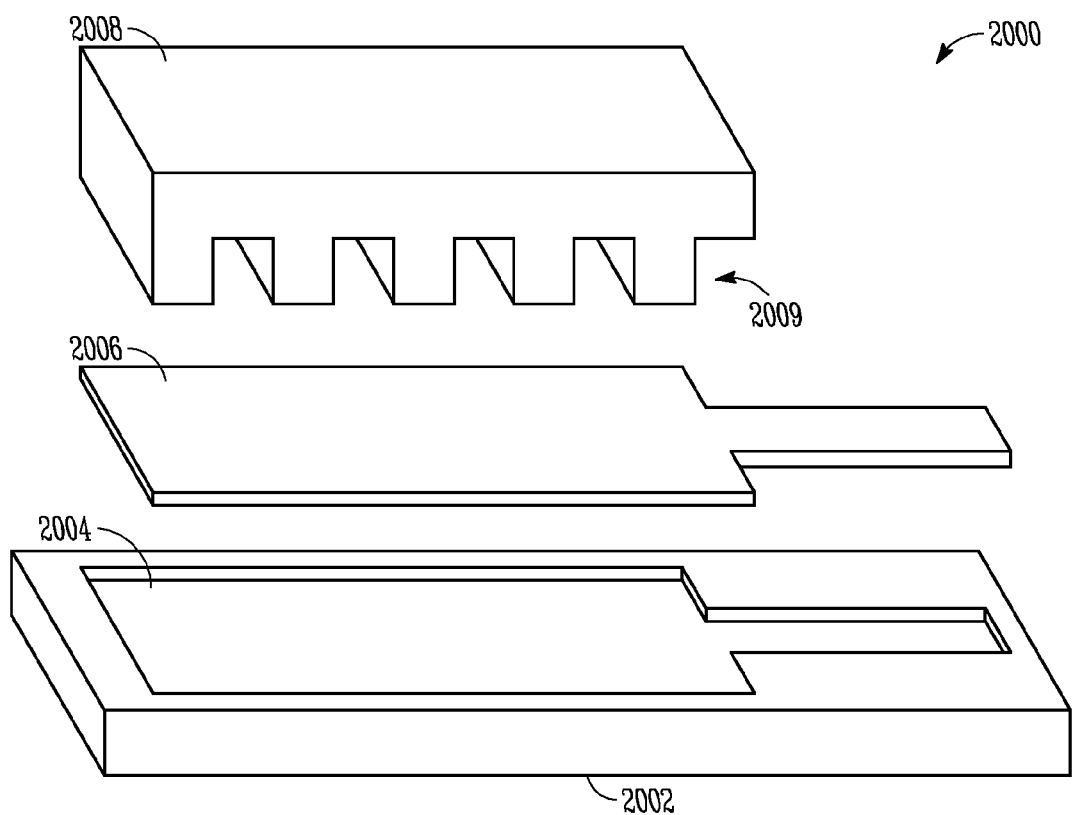
FIG. 20 is a block diagram of a test configuration to test a touch sensor having interpolated electrodes, according to an example embodiment.

FIG. 20 illustrates a test system 2000 to test an interpolated touch sensor, such a touch sensor including an ITO film 2006. The cover 2008 is positioned to contact the active electrodes of the film 2006, such as electrodes within shaded area 1520 of FIG. 16. The test system 2000 may also be used to test the interpolated electrodes 1504 by repositioning the cover 2008 to contact the interpolated areas of the film 2006, such as electrodes 1530 of FIG. 15. The test system 2000 is similar to the test system 1400 of FIG. 14, however, the test system 2000 is enhanced to accommodate a touch sensor 1500 having interpolated electrodes 1504.

The test system 2000 includes a base plate 2002 for receiving a device under test 806, such as touch sensor 1500 of FIG. 15. The base plate 2002 may be made of a dielectric or other material as required to interface with the sense electrodes. The device under test 2006 may be an ITO film formed on a substrate to provide conductive traces to form drive electrodes. In another example, the cover 2008 illustrated in FIG. 20 may cover the active electrodes within shaded area 1520, and then cover the interpolated electrodes 1530. The method, techniques, and test systems described herein are provided as examples for clarity and understanding.

The shape of a position frame shape 2004 complements the shape of device under test 2006. The test system 2000 further includes a conductive cover 2008, which may be a conductive foam or other conductive material or element, so as to allow isolation of the individual electrodes or sets of electrodes for testing. The shape of the cover 2008 is configured to meet the dimensions of the drive layer of touch sensor 1500. Therefore, the cover 2008 has multiple extensions protruding from an upper base, the extensions sized so as to contact the active electrodes within the shaded area 1520 while avoiding the interpolated electrodes 1530. In the test system 2000, the cover 2008 is designed for use with the active electrodes within shaded area 1520 for a first test, and for use with the interpolated electrodes within shaded area 1530 for a second test. By applying loading directly to the interpolated electrodes 1530, a more accurate measurement may be obtained, and a common range of values may then be used for evaluation. In some embodiments, separate covers are used to contact the interpolated electrodes 1530 in a separate test.

In some examples, the structure of the touch sensor 1500 of FIG. 15 includes a distance between an active electrode 1502, such as X0, and a successive interpolated electrode 1504, such as $XO_{INTERPOLATED}$, is approximately constant. Similarly, the distance between the successive interpolated electrode 1504 $XO_{INTERPOLATED}$, and a next successive active electrode 1802, such as X1, is approximately constant. In such a configuration, the conductive foam cover may be a single shape to cover one of the electrodes, such as the electrodes in the shaded areas 1520 or 1530. In this example, the conductive foam cover is shifted to cover each electrode under test. The testing system 2000 may be used to apply multiple capacitive load conditions to the device under test 2006, so as to identify capacitance across different electrode combinations.

Figure 21:
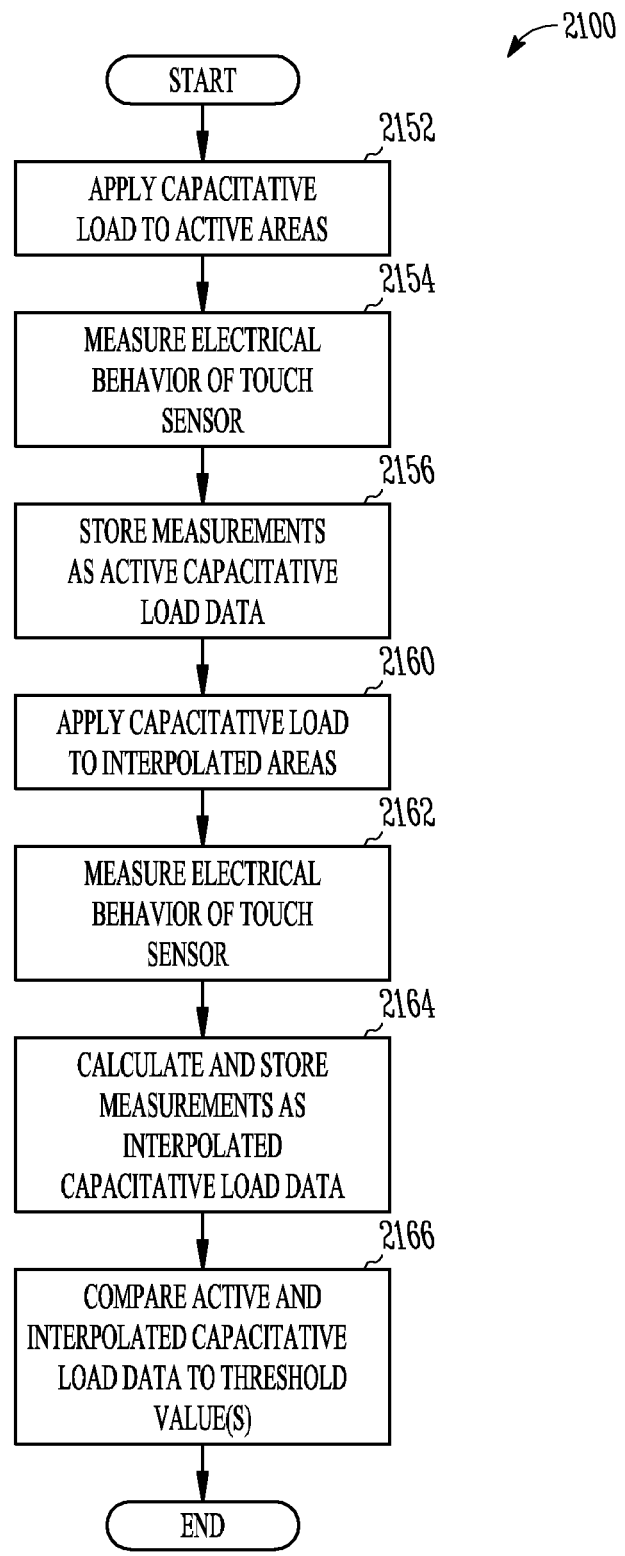
FIG. 21 is a flow diagram for a method of testing a touch sensor having interpolated electrodes, according to an example embodiment.

A method 2100 for testing a touch sensor is illustrated in FIG. 21, and includes activities to apply 2152 a capacitive load to active areas of the touch sensor. The active areas correspond to electrodes in the shaded area 1520 of FIG. 15, which includes at least one active electrode 1502, and may include the set of active electrodes 1502. The method 2100 may be implemented using the test system 2300 of FIG. 23 or another test circuit or system which allows application of capacitive loads to the set of active electrodes 1502 to the exclusion of the set of interpolated electrodes 1504.

Similarly, the test method 2100 further includes activities 2154 to measure 2154 the electrical behavior of the active areas, as well as activities 2156 to calculate and store 2156 the measured values as active capacitive load data, such as in a data array. In some embodiments, the measured values are used to calculate a mutual capacitance value, which is stored as the active capacitive load data. The capacitive load is then applied 2160 to interpolated areas, such as to the electrodes of shaded area 1530 of FIG. 20, which includes at least one interpolated electrode 1504, and may include the set of interpolated electrodes 1504. The method 2100 further includes activities to measure 2162 the electrical behavior of the active areas 1530, as well as to calculate and store 2164 the mutual capacitance values as interpolated capacitive load data. Additional capacitive loads may be considered to identify electrical behavior and responses of the touch sensor 1500. The active and interpolated capacitive load data is then compared 2166 to threshold values.

The test methods and techniques described herein may be implemented using a variety of test equipment, systems and environments. Application of such methods for evaluation of dual layer capacitive device, such as touch sensors, allows identification of faults or unacceptably performing units, and further may be included as part of a trouble shooting process which is initiated on failure of a device. The methods and techniques may be implemented by a test system including hardware, software and firmware, which may be application-specific or have general applicability. Further, these techniques may be used to enhance existing test methods, or to simplify a test system that has more complex and detailed hardware arrangements.

Figure 22:
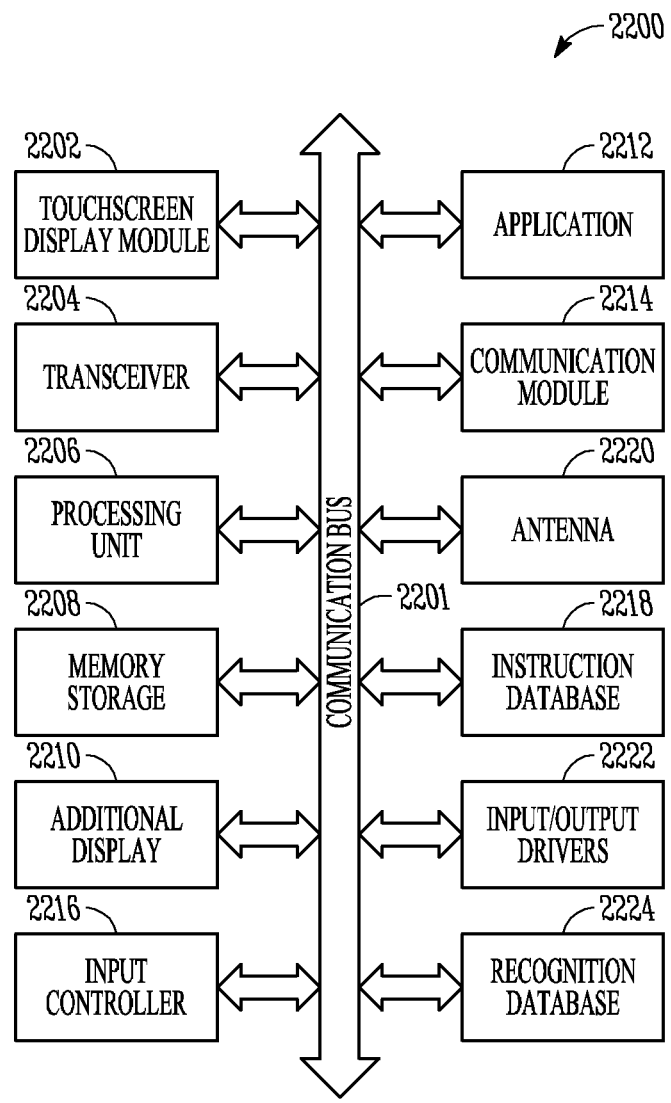
FIG. 22 is a block diagram of a device implementing a touch sensor, according to an example embodiment.

As discussed with respect to the configuration of the driving and sensing lines, a variety of combinations and shapes are used in the design of a touch sensor device. A touchscreen display system having a touch sensor, such as touch sensor 525 or 1500 as discussed in the examples and embodiments provided herein, may be implemented as touchscreen display module 2202 of apparatus 2200 illustrated in FIG. 22. The apparatus 2200 may be a hand held device or other type of apparatus, including a transceiver 2204, antenna 2220 and communication module 2214, for providing wireless access to the apparatus 2200. The wireless communications may be cellular communication or Wireless Local Area Network (WLAN) communications, such as supporting a Wi-Fi protocol specified by the set of standards IEEE 802.11. The communication module 2214 may support other protocols, and may support multiple protocols. The antenna 2214 may be configured to support the communication protocols as instructed by communication module 2214. The apparatus 2200 also includes a processing unit 2206, and a communication bus 2201 for implementing controls throughout apparatus 2200 and for communicating information to the various components within apparatus 2200. The processing unit 2206 executes routines and instructions stored in an instruction database 2218, and which may work in coordination with an application 2212. A memory storage unit 2208 may include volatile memory and non-volatile memory or both, and may be used to store measurement data, reference values for testing the touchscreen display module 2202 and other data. An additional display 2210 provides additional display of images and information, and may be implemented as a touchscreen display or other type display. Input/Output (I/O) drivers 2222 receives input information for the additional display 2210, which may be controlled by input controller 2216. Further, a recognition database 2224 stores information to assist in identification of inputs received via the touchscreen display module 2202. The information stored in the recognition database 2224 may identify a shape, size, location or movement of a touch event at the touchscreen display module 2202. The apparatus 2200 may use the methods and techniques described herein for testing the touchscreen display module 2202 to evaluate performance of the module 2202 individually and in coordination with the other components of apparatus 2200.

Figure 23:
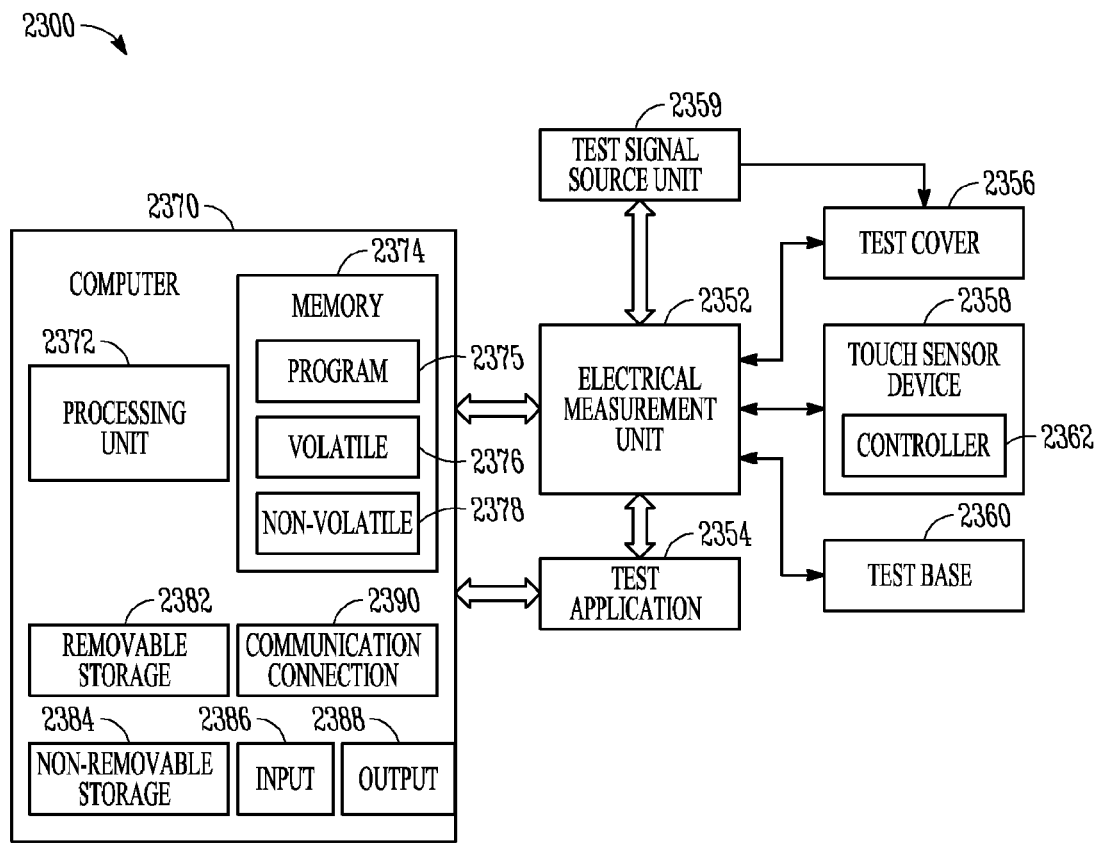
FIG. 23 is a block diagram of a testing system, according to an example embodiment.

FIG. 23 illustrates an example embodiment of a testing system 2300 including a test application 2354 and an electrical measurement unit 2352 coupled to a test cover 2356 and a test base 2360. The test cover 2356 applies a conductive material to a touch sensor device 2358. A test application 2354 provides instructions to an electrical measurement unit 2352 for applying active signals to driving lines of the touch sensor device 2358, for providing electrical test conditions to the test cover 2356, and for measuring signals from the sensing lines of touch sensor device 2358.

The test methods and techniques for a touch sensor or touchscreen device may be performed by execution of programming by a general computing device in the form of a computer 2370, which may include a processing unit 2372, a memory 2374, a removable storage 2382, and a non-removable storage 2384. The memory 2374 may include a volatile memory 2376, a program memory 2375, and a non-volatile memory 2378. The computer 2370 may also include—or have access to a computing environment that includes—a variety of computer-readable media, such as volatile memory 2376 and non-volatile memory 2378, removable storage 2382 and non-removable storage 2384. Computer storage includes Random Access Memory (RAM), Read Only Memory (ROM), Erasable Programmable Read-Only Memory (EPROM) & Electrically Erasable Programmable Read-Only Memory (EEPROM), flash memory or other memory technologies, Compact Disc Read-Only Memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 2370 may include or have access to a computing environment that includes input 2386, output 2388, and a communication connection 2390. The computer 2370 may operate in a networked environment using the communication connection 2390 to connect to one or more remote computers. The remote computer may include a Personal Computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 2372 of the computer 2370. A hard drive, CD-ROM, and RAM are some examples of articles including a computer-readable medium. In one embodiment, a controller 2362 located with the touch sensor device 2358 controls test methods performed within the test system 2300. The controller 2362 provides instructions as to the capacitive load and the test signals for application to the touch sensor device 2358. The controller 2362 may also receive the sense signals, the calculated mutual capacitance values, or an intermediate value or calculation. The controller 2362 may further interface with the electrical measurement unit 2352 to modify the test conditions in response to a test result. For example, the controller 2362 may act to modify the test conditions when a fail is detected. In this way the test system 2300 may be used to test touch sensor devices according to a variety of quality criteria, where higher quality units have strict threshold ranges for evaluation, and lower quality units having less strenuous thresholds are commercialized as a different commodity.

In one embodiment, an IC package incorporates a touch sensor, such as touch sensor 425 or 525, employing a charge-transfer sensing electrode design. In the IC, charge is forced from an emitting electrode into the overlying panel dielectric, and then collected on a receiver electrode which directs the charge into a sampling capacitor which is then converted directly to digital form without the use of amplifiers. The electrodes can be designed into a conventional PCB or Flexible PCB (FPCB) as a copper pattern, or as printed conductive ink on plastic film. Various IC packages and configurations are possible for implementing a touch sensor. The IC is provided as an example to illustrate a variety of testing scenarios.

The pin out of an IC in one embodiment includes various voltage input pins, including supply ground ($V_{SS}$), power ($V_{dd}$), matrix drive lines (X), Y line connect or sense lines (Y), synchronization pins, Input/Output (I/O), and others. The driving lines may be accessed via pins X0, X1, through X15, and the sensing lines accessed via Y0, Y1, through Y5. The pin out configuration of the example IC provides access to the various drive and sense lines to implement a dual layer test method.

The methods and apparatus described may be used in conjunction with an appliance having a human-machine interface. It is also possible to provide a sensor similar to those described above which is provided separately from a device/appliance which it may be used to control, for example to provide an upgrade to a pre-existing appliance. It is also possible to provide a generic sensor which may be configured to operate a range of different appliances.

Although the test methods and apparatuses have been described with respect to several embodiments, many modifications and alterations are considered as well. The drawing provided are not intended to identify a particular size or scale of a module, but rather are provided for clarity of understanding as to testing and evaluation of a dual layer device. The concepts described herein may be applied to product enhancement involving introduction of a dual layer device, where measurement of values in a single layer device required complex circuitry or prove difficult in an assembled package.

The invention claimed is:

1. A method, comprising:
   supplying a test signal to a driving layer of a touch sensor while the touch sensor is in an ambient state;
   measuring received signals at a sensing layer of the touch sensor, the sensing layer being electrically isolated from the driving layer, the measured received signals having measurement values corresponding to mutual capacitances between the driving layer and the sensing layer;
   supplying the test signal to the driving layer while the touch sensor is in a capacitive load state, wherein the capacitive load state identifies a state of the touch sensor when a capacitive load is applied to at least a portion of the driving layer;
   measuring the received signals at the sensing layer; and
   comparing the measurement values to target threshold values to identify a fault point in a device.

2. The method of claim 1, wherein the test signal is an alternating current signal having a drive peak-to-peak voltage value, and wherein measuring the received signals at the sensing layer further comprises measuring sense peak-to-peak voltages of the received signals.

3. The method of claim 1, wherein the test signal is an alternating current signal having a drive peak-to-peak voltage value, and wherein measuring the received signals at the sensing layer further comprises measuring effective voltages of the received signals.

4. The method of claim 1, wherein the test signal is an alternating current signal having a drive peak-to-peak voltage value, and wherein measuring the received signals at the sensing layer further comprises measuring a maximum voltage of the received signals.

5. The method of claim 1, wherein the touch sensor is specified to operate within a minimum voltage and a maximum voltage over a range of touch events, and the ambient state and the capacitive load state are to simulate a plurality of touch events.

6. The method of claim 1, wherein the driving layer includes a plurality of conductive traces.

7. The method of claim 6, further comprising:
  storing measured received signal data corresponding to the ambient state in a memory storage unit as ambient data; and
  storing measured received signal data corresponding to the capacitive load state in the memory storage unit as capacitive load data, wherein the capacitive load state identifies a state of the touch sensor when the capacitive load is applied to the at least a portion of the driving layer.

8. The method of claim 7, wherein the plurality of conductive traces include a set of active electrodes and a set of interpolated electrodes, and wherein supplying the test signals to the driving layer in the capacitive load state comprises:
  applying the capacitive load to the set of active electrodes corresponding to an active capacitive load state for the touch sensor;
  supplying the test signal to the driving layer while the touch sensor is in the active capacitive load state;
  measuring the received signals at the sensing layer while the touch sensor is in the active capacitive load state;
  applying the capacitive load to the set of interpolated electrodes corresponding to an interpolated capacitive load state for the touch sensor;
  supplying the test signal to the driving layer while the touch sensor is in the interpolated capacitive load state; and
  measuring the received signals at the sensing layer while the touch sensor is in the interpolated capacitive load state.

9. The method of claim 6, wherein supplying the test signal to the driving layer further comprises supplying the test signal to one of the plurality of conductive traces of the driving layer, and wherein the sensing layer includes a plurality of conductive traces, and measuring the received signals at the sensing layer further comprises measuring the received signals at each of the conductive traces while supplying the test signal to the one of the plurality of conductive traces of the driving layer.

10. The method of claim 9, wherein the method is repeated for each of the plurality of conductive traces of the driving layer.

11. The method of claim 1, further comprising calculating at least one value corresponding to a mutual capacitance based on the measured received signals, and comparing the at least one value to a designated threshold to identify a fault condition in the touch sensor.

12. A test system apparatus, comprising:
  an electrical measurement unit operable to:
    apply a test signal to a conductive trace of a first plurality of conductive traces formed in a driving layer of a device; and
    measure at least one electrical characteristic of a sensing layer of the device, the sensing layer comprising a second plurality of conductive traces;
    apply a capacitive load to at least a portion of the plurality of conductive traces formed in the driving layer via a conductive cover unit; and
    measure the at least one electrical characteristic of the sensing layer with the capacitive load applied to the at least a portion of the first plurality of conductive traces; and
  a processing unit to:
    compare a measurement of the at least one electrical characteristic to threshold values; and
    generate a failure report when the measurement violates a first threshold value of the threshold values.

13. The test system apparatus of claim 12, further comprising:
  a base unit to accept the device; and
  the conductive cover unit.

14. The test system apparatus of claim 13, wherein the conductive cover unit includes a first portion of contacts for connecting the capacitive load to the at least a portion of the first plurality of conductive traces formed in the driving layer.

15. The test system apparatus of claim 13, further comprising: a memory storage unit to store the threshold values.

16. The test system apparatus of claim 15, wherein the threshold values include a first threshold value corresponding to an ambient state of the device, and a second threshold value corresponding to a capacitive load state of the device.

17. The test system apparatus of claim 16, wherein the first plurality of conductive traces includes a set of active electrodes and a set of interpolated electrodes, and wherein the processing unit is further operable to:
  compare the measurement of the at least one electrical characteristic taken when the capacitive load is applied to the active electrodes to the first threshold value, and
  compare the measurement of the electrical characteristic taken when the capacitive load is applied to the interpolated electrodes to the second threshold value.

18. The test system apparatus of claim 13, further comprising:
  a memory storage unit to store the measurement of the at least one electrical characteristic.

19. The test system apparatus of claim 18, further comprising:
  a test application unit to store computer-readable instructions to:
    select a first test signal to test the device; and
    select a capacitive load to test the device.

20. A non-transitory computer-readable medium comprising instructions, which when implemented by one or more machines, cause the one or more machines to:
  measure an ambient electrical characteristic of a dual layer sensor while in an ambient state, the dual layer sensor having a driving layer and a sensing layer;
  measure a capacitive load electrical characteristic of the dual layer sensor while a capacitive load is applied to the driving layer;
  compare the ambient electrical characteristic and the capacitive load electrical characteristic to corresponding threshold values;
  report a failure when the measured ambient electrical characteristics violates an ambient threshold value; and
  report a failure when the measured capacitive load electrical characteristic violates a capacitive load threshold value.

21. The non-transitory computer-readable medium of claim 20, wherein the device is a touch sensor, and wherein the instructions are further to supply a test signal to a conductive trace of the driving layer and to measure received signals at each of a plurality of conductive traces in the sensing layer.

22. A test apparatus, comprising:
   a base plate having a position frame portion to receive a dual layer device, the dual layer device comprising a first plurality of conductive traces formed in a driving layer and a second plurality of conductive traces formed in a sensing layer; and
   a conductive top layer to apply a conductive load to the dual layer device for test, the conductive top layer having a plurality of elongated members configured to couple with at least a portion of the first plurality of conductive traces on the driving layer of the dual layer device.

23. The test apparatus of claim 22, wherein the test apparatus includes an input port to receive instructions for testing the dual layer device, wherein the testing is to measure an electrical characteristic of the dual layer device, and the electrical characteristic related to a mutual capacitance between the driving layer and the sensing layer of the dual layer device.

24. The test apparatus of claim 22, wherein the apparatus is part of a testing system, the testing system comprising:
   a signal source unit to supply the test signal to the test apparatus; and
   an electrical measurement unit to measure the electrical characteristic; and
   a load generator to supply at least one capacitive load to the dual layer device.

25. The test apparatus of claim 22, wherein the conductive top layer comprises a conductive foam.

* * * * *